United States Patent [19]

Anderson et al.

[11] Patent Number: 4,926,139

[45] Date of Patent: May 15, 1990

[54] ELECTRONIC FREQUENCY FILTER

[75] Inventors: James R. Anderson, Chicago; Richard Brander, Cicero, both of Ill.

[73] Assignee: Beltone Electronics Corporation, Chicago, Ill.

[21] Appl. No.: 203,334

[22] Filed: Jun. 6, 1988

Related U.S. Application Data

[62] Division of Ser. No. 838,924, Mar. 12, 1986, Pat. No. 4,792,977.

[51] Int. Cl.$^5$ .............................................. H03F 1/34
[52] U.S. Cl. ................................. 330/294; 330/107; 330/306
[58] Field of Search ............... 330/107, 109, 126, 151, 330/294, 306; 307/520; 333/28 T; 381/98, 101, 102

[56] References Cited

U.S. PATENT DOCUMENTS

| | | | |
|---|---|---|---|
| 3,924,199 | 12/1975 | Pearlman | 330/107 |
| 3,969,682 | 7/1976 | Rossum | 330/107 X |
| 4,288,754 | 9/1981 | Okada et al. | 330/306 X |
| 4,301,420 | 11/1981 | Sugawara | 330/306 X |
| 4,453,132 | 6/1984 | Stamler | 330/107 |

OTHER PUBLICATIONS

Franco, "Use Transconductance Amplifiers," *Electronic Design* 19, Sep. 13, 1976, pp. 98–101.

Hill, "Digital Control of Active Filter Characteristics", *International Journal of Electronics*, vol. 41, No. 4, Oct. 1976, pp. 405–410.

Sugawara et al., "A Volume and Frequency Response Control IC for Audio" IEEE *J. of Solid-State Circuits*, vol. SC-15, No. 6, Dec. 1980, pp. 968–971.

*Primary Examiner*—James B. Mullins
*Attorney, Agent, or Firm*—Allegretti & Witcoff, Ltd.

[57] ABSTRACT

A hearing aid that is compact and efficient and that provides a high degree of control over its frequency response and also over its output level versus input level characteristic. The frequency response control includes an adjustable four pole high pass filter and an adjustable four pole low pass filter, to define the pass band, and an adjustable slope filter, to define the slope within the pass band. The control over the output level versus input level characteristic includes an input AGC system with well defined, independent control of compression threshold and compression ratio, an adjustable peak clipper, and a selectable output AGC system that tracks the peak clipper setting. The hearing aid incorporates a number of novel circuits including a state variable filter with adjustable corner frequency, a filter that can be continuously adjusted from a single pole low pass characteristic to a single pole high pass characteristic, a circuit to provide a range of reference voltages to accurately set the range of control currents used to control the corner frequencies of the state variable filters, a compansion system surrounding the filter network to effectively increase its limited dynamic range, a differential voltage threshold detector, a differential voltage controlled current source with an exponential relationship of output current to differential input voltage, an adjustable clipping circuit, a voltage clamp to prevent voltage excursions from going substantially below a substrate voltage, and bias compensation circuit to supply the input bias current of a transistor.

6 Claims, 16 Drawing Sheets

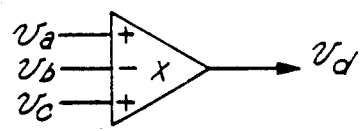
Fig. 6
Fig. 7
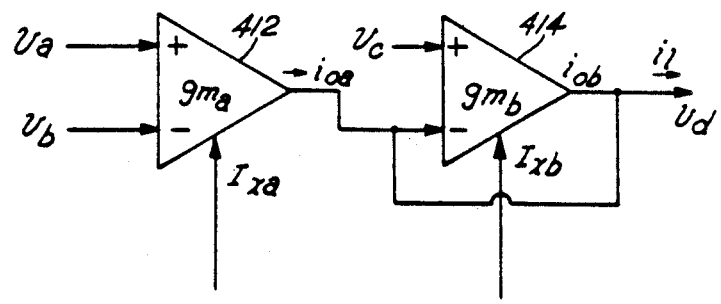
Fig. 8
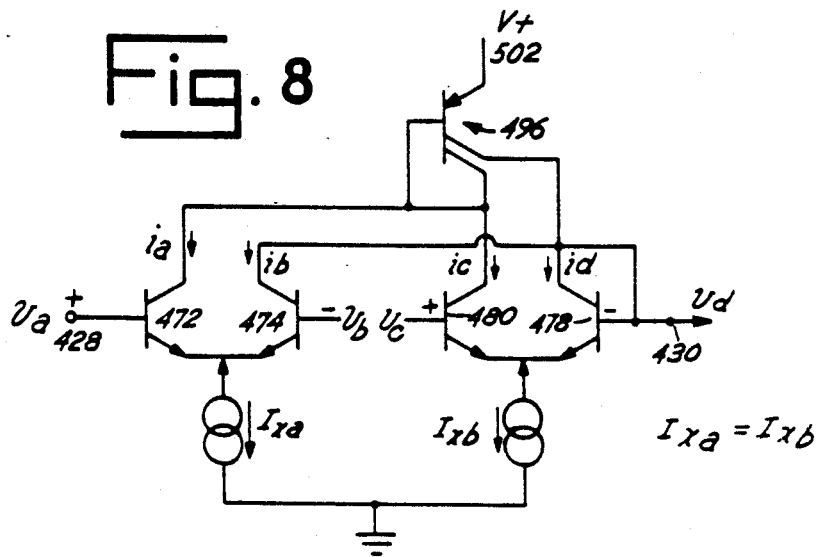
$I_{xa} = I_{xb}$ 507, 509 MAY BE PARRELLEL-CONNECTED TRANSISTORS

ELECTRONIC FREQUENCY FILTER

This is a division of application Ser. No. 838,924, filed Mar. 12, 1986, now Pat. No. 4,792,977.

BACKGROUND OF THE INVENTION

The present invention relates generally to hearing aids, and more particularly, to circuits that more compactly, economically, and effectively present a modified and amplified sound for the wearer of a hearing aid. In its most basic form, a hearing aid is a device which receives a sound signal and furnishes a modified sound signal to the wearer of the hearing aid, so that the wearer may hear better.

Hearing impaired persons differ considerably in the degree and pattern of their hearing loss. This is reflected in their audiograms.

An audiogram is a chart of hearing threshold level (HTL) versus frequency. The HTL is measured on a logarithmic (decibel) scale and compares an individual's threshold of detection of a tone to that of normal hearing persons.

Audiograms can differ in level from near normal (0 dB HTL) to profound loss (greater than 100 dB HTL). They can vary in pattern from a flat audiogram (approximately equal HTL over the relevant frequency range) to a sharply falling audiogram (HTL increasing at more than 30 dB per octave of frequency increase) or to a rising audiogram (HTL decreasing with frequency). Within the category of sharply falling audiograms, the frequency at which the audiogram begins to fall can vary greatly between individuals.

Patterns of hearing loss can also differ considerably in the relationship between the subjectively experienced loudness and the input sound pressure level. Not only are there wide differences in the lowest level that the ear can perceive (the HTL), there are also wide differences in the highest level that the ear can tolerate (the loudness discomfort level or LDL) and differences in the rate of growth of loudness between these two extremes. In some cases, a much higher than normal HTL is combined with a lower than normal LDL, giving a much reduced dynamic range of usable sound levels.

Because of the large differences in degree and pattern of hearing loss, there is also a wide range of hearing aid characteristics required to optimally assist hearing impaired persons. The frequency response of the hearing aid must be selected for the individual hearing loss and may require high order filtering with selection of frequency bandwidth as well as general shape within that bandwidth. The gain of the hearing aid must be selected in accordance with the degree of the hearing loss.

The limiting level of the hearing aid must be selected in accordance with the LDL. A selection of the type of output limiting must be made between peak clipping, or output Automatic Gain Control ("AGC"). Output AGC is an automatic gain control system whose action is related to the output level of the hearing aid. This relation is substantially independent of the setting of the user operated volume control.

If the ear has a much reduced dynamic range, an input AGC system may be needed. Input AGC is an automatic gain control system whose action is related to the input level to the hearing aid. The relation between the action of the input AGC and the input level is also substantially independent of the setting of the user-operated volume control. In the case of an input AGC, a selection must be made of the compression threshold, (the input level at which AGC action begins), and the compression ratio, (the ratio of the decibel change in input to the decibel change in output level).

It is desirable that a single hearing aid be provided with a range of adjustability in these various characteristics. This is important not only because it allows a single hearing aid model to be used for many persons with differing hearing losses, but also because it allows the hearing aid to be readjusted if the initial selection of hearing aid characteristics was incorrect or if the user's hearing loss changes with time.

Because hearing aids are normally worn on the head, they must be small and usually operate with a small, single cell battery for extended periods of time. They must also provide good performance, be highly reliable, and be low in cost. The electronic circuits used to provide the various functions of a hearing aid must also have these same characteristics. Of course, such circuits will also be useful in applications other than hearing aids but having similar requirements.

Prior hearing aids have had limitations in meeting the needs described above. They have been limited in the degree of filtering provided to control the frequency response. When equipped with an input AGC system, they have not provided a well-defined compression threshold and a well defined compression ratio. Also, they have not provided the needed degree of adjustability in either their frequency response characteristics or in their output level versus input level and AGC characteristics.

Prior electronic circuits also have had limitations in meeting the needs described above. Circuits that are small in size and that can operate with a low supply voltage of about 1.3 volts and that draw little supply current have not provided good performance and have not provided the desired adjustment characteristics. Prior electronic circuits that could meet the performance needs described above have required higher supply voltage and current, have required many components, have been large in size, or have not been in a form in which they could be adjusted by operation of a single control.

The subsystems, or specific circuits, which help achieve the general objectives for hearing aids have their own specialized goals. Such specific goals are discussed in more detail below.

SPECIFIC SUBSYSTEMS

Filters

In many electronic circuit design applications, such as hearing aids, an input signal is provided. The input signal must then be modified by an appropriate filter. These modifications consist of attenuating the various frequency components of the input signal to differing degrees.

Thus, for example, a hearing aid wearer may have a more serious hearing impairment for sounds having a high frequency than for sounds having a low frequency. Accordingly, a hearing aid should amplify high frequency signals more strongly than the low frequency signals. An appropriate filter may then be used to allow high frequency signals to pass through it substantially unaltered and to substantially attenuate low frequency signals.

In the example described above, the filter is called a highpass filter, since high frequency signals are allowed to pass through the filter substantially unmodified. In addition, a lowpass filter allows only low frequency signals to pass through substantially unattenuated. Still others, known as bandpass filters, only allow signals having frequencies within a specified range to pass through the filter substantially unattenuated.

In designing a hearing aid, it is desirable to use a more effective and yet compact frequency response filter. Frequency responsive filters are commonly shown in the prior art. For highpass or lowpass filters, a predetermined frequency, known as the corner frequency or characteristic frequency of the filter, substantially divides those signals which are allowed to pass through the filter and those which are attenuated. One type of electronic frequency filter employed in a variety of applications is called a Butterworth filter. For example, in a lowpass Butterworth filter, signals having a frequency less than the corner frequency are allowed to pass through the filter substantially unimpaired. A signal with the frequency of the corner, however, is attenuated by approximately three decibles. Signals with a frequency in excess of the corner frequency are attenuated even more than three decibels.

Filters are further characterized by their number of poles. A pole is a complex frequency root of the denominator of the transfer function. The higher the number of poles, the higher will be the rate of attenuation of a Butterworth filter beyond the corner frequency. For example, a two pole highpass or lowpass filter will have a rate of attenuation of 12 decibels per octave and a four pole filter will have a rate of 24decibels per octave. In many applications it is desirable to have a four pole filter.

Many applications require filters to be as compact and efficient as possible. For example, hearing aids often rest behind or inside the user's ear. Because of the resulting space limitations, all circuits within the hearing aid, including the frequency filter, should be small. Accordingly, the number of components in each circuit should be reduced.

Also, many applications require that the corner frequency of the filter be adjustable. For example, in hearing aids, users that require amplification of different frequencies may use the same hearing aid simply by adjusting the corner frequency of the filter. A user requiring amplification of signals with a frequency above 500 hertz and another second user, needing amplification of signals above 1000 hertz, may both use the same aid by adjusting the corner frequency of the filter, which determines the frequency response of the aid. Nonetheless, such an adjustable filter should still be as compact as possible.

In addition, the varying of the corner frequency of the filter should, if possible, use only a single control. This allows the adjustment of the corner frequency to be done more easily, as well as allowing the manufacture of the aid to be less expensive and providing a more reliable aid.

Furthermore, since a manually adjusted control element is often mounted in a location remote from the filter circuit, it is advantageous if the input signal does not pass through this control element, but rather that the control element varies a control signal which indirectly influences the corner frequency of the filter. Such an arrangement reduces difficulties that may be encountered with feedback, capacitive coupling, or the pickup of unwanted noise, which will affect the actual signal. Moreover, the control signal may be provided by a manually adjusted potentiometer or may be a signal originating with some other processing system within the aid itself. The control signal should be derived from a regulator that produces reference signals that accurately set the adjustment range of the corner frequency control.

In addition, to further decrease the size of the circuit, a large portion of the circuit should be formed on integrated circuits. In many cases, it is desirable to use semi-custom integrated circuits which contain large numbers of substantially identical circuit elements which may be interconnected as desired. Accordingly, the circuit should advantageously use greater numbers of integer multiples of such identical transistors in its design. Also, such integer multiples of substantially identical transistors may be used to increase the accuracy of the expected performance of the circuit.

Many circuit components used in hearing aids are formed on an integrated circuit chip. Transistors and amplifiers are readily available on such chips and usually do not take up inordinate amounts of space. Resistance elements, however, take up large amounts of space (or "real estate") on the chip. Moreover, the absolute value of a resistor formed on a chip is typically not easily kept within a close tolerance. Such typically wide tolerances would make the circuit performance less accurate. External discrete resistors interconnected with the chip may also be used, but such discrete components also use up much of the space available inside of an aid and also require additional connection points to the chip.

Other elements used in a circuit, such as capacitors, are difficult to fabricate on a chip. Of course, if discrete capacitors are used, they, like discrete resistors, take up space inside the aid, so that their number and size should be minimized. Also, the number of connection points to the chip should be minimized.

It is also helpful if the capacitors used have substantially equal values. In this way, the manufacturer need keep fewer items in inventory. Also, he may purchase larger quantities of the single type of capacitor (rather than smaller quantities of different types of capacitors), and thus possibly obtain the capacitors for a lower price. Consequently, the costs for both the manufacturer and consumer may be reduced. Moreover, the use of a single type of capacitor reduces the chance of "mixup", whereby an improper capacitor is used in the manufacture of the aid.

In addition, it is often desirable to have a common AC ground connection to one side of each capacitor. Such an arrangement tends to reduce the noise sensitivity of the circuit. Moreover, the circuit may then have fewer pad connections between capacitors and the integrated circuit, thereby reducing the cost and increasing the reliability of the circuit.

Of course, the filters should function properly with the voltage level supplied by a hearing aid battery, which is typically in the order of only one volt. Additionally, the filter shall operate with a small current drain, so as to increase the operating life of the battery.

Many commonly available filters only provide a highpass or lowpass or bandpass transfer function, rather than the providing simultaneous highpass, lowpass, and bandpass outputs for a particular input signal. Simultaneous outputs are useful, for example, to split an input signal into highpass and lowpass channels.

Input AGC

In many applications, such as hearing aids, it is desirable that a signal amplification or signal transmission system provide a lower gain for high level input signals than for low level input signals. With such an arrangement, a large range of input signal levels can be transformed into a smaller range of output signal levels.

Such an automatic gain control system ideally is described by a compression threshold and a compression ratio. For input signals below the compression threshold, the signal gain is constant and there is no gain reduction. At the compression threshold, gain reduction begins, and, for signal levels increasing above the compression threshold, the gain is progressively reduced. As a result, the rate of change of output level is smaller than the rate of change of input level. The compression ratio relates to signal levels above the compression threshold and is the ratio of the decibel change in output level to the decibel change in output level. Often it is desirable to provide independent adjustment of compression threshold and compression ratio in order to accommodate different types of input signals or different needs of users of the output signal.

In an automatic gain control system, it is often important that the gain be changed smoothly without spurious response. Such a spurious response can occur, for example, if the control signal used to adjust an amplifier gain produces a shift or temporary offset in the amplifier output operating current or voltage at the same time as it is changing amplifier gain. This type of spurious response can be heard as a "thump" occurring during large gain change and generally should be avoided.

It is desirable also that the detector used to sense signal level in an automatic gain control system should respond to both positive and negative excursions of the signal. This provides a more accurate determination of level and produces less signal distortion.

In a hearing aid, such an AGC system may be placed in the signal path from microphone to receiver. The level detector is properly located in this signal path at a point before the user-operated volume control. In this location, the system is called "input AGC", since the AGC action depends on the input signal level, independent of the setting of the volume control.

If the hearing aid is also equipped with a widerange tone control, or adjustable filter, it is also desirable that the AGC level detector be placed at a point in the signal path after the filter. In this way, the AGC acts only on the range of frequencies actually being utilized. It would not act on signals rendered inaudible by filtering. If on the other hand, for example, if the AGC detector sensed signal levels before a four pole highpass filter, the AGC system would respond to otherwise inaudible low frequency components of the input signal. As a result the system would produce changes in gain that would unnecessarily and undesirably affect simultaneously occurring high frequency components of the input signal.

In many applications of such an AGC system, it must be as compact and efficient as possible. It must be of a form suitable for implementation on a monolithic integrated circuit and should require few components external to the integrated circuit clip and few interconnections. It should operate on low supply voltage and require little supply current.

Compansion System

In many electronic systems, it is necessary to transmit signals possessing a high dynamic range through a circuit or circuit element providing limited dynamic range. The dynamic range is the range of signal levels from the lowest useful signal level, usually determined by a noise level, to the highest useful signal level, determined either by the characteristics of the signal itself or by the limiting level or distortion characteristics of the circuit or element.

For example, in a hearing aid, an active filter with adjustable corner frequency normally requires the use of active circuit elements that have a limited dynamic range. With the input AGC system previously described, the active filter is located at a point in the signal path before the user-operated volume control; therefore the input signal level to the active filter cannot be adjusted by the user. If the input signal passes through the filter, the resulting dynamic range will be severely degraded.

This problem is similar to the problem of conveying signals through a transmission medium of limited dynamic range, for example, as in magnetic tape recording and playback. In such cases, some systems, such as the Dolby system, have been developed which compress the signal with some type of automatic gain control system before recording and expand the signal with another AGC system after playback. However, in such systems, the two AGC systems act independently of each other, with the result that attack and release transients are not cancelled out. See U.S. Pat. No. 4,377,792.

What is needed is a compression-expansion ("compansion") system that compresses the signal being applied to the circuit of limited dynamic range and expands the signal leaving that circuit in a substantially exact, complementary manner, without exhibiting attack and release transients at the output of the expander. This compansion system should be compact in size and efficient.

An electronic system may already include an amplifier whose gain is varied by a control signal, such as a hearing aid with an input AGC system. In this case, it is advantageous to consolidate functions. Instead of having two variable gain amplifiers, each controlled by its own control signal, it is better to use a single variable gain amplifier controlled by a composite control signal. This requires a compact, efficient circuit for combining control signals in the proper manner.

Output Limiting

In many electronic systems, such as hearing aids, the output signal level must not increase indefinitely, but must be limited in some manner. Two techniques have been used for this purpose: peak clipping and output AGC limiting. In either case, it is often useful to have an adjustable limiting level.

In many circumstances, a peak clipper should limit the maximum output signal level to a limiting level selected by adjustment of a power level control. At the same time, the peak clipper should substantially maintain a constant gain as the power level control is adjusted for signal levels below the limiting level.

The clipper should clip both positive and negative excursions of the waveform symmetrically. It should also have an easily adjustable clipping level. It is also desirable that adjusting the clipping level should not change the frequency response for input signal levels below or well above the clipping level.

For many hearing aids with single-ended Class A output stages, the clipping level is adjusted by a variable resistor in series with the receiver. This arrangement does not produce symmetrical clipping. It also results in a hearing aid gain that changes with clipping level and a frequency response that changes with clipping level.

For many hearing aids with push-pull Class AB output stages, the clipping level is adjusted by a variable resistor in series with the center tap of a receiver. This produces symmetrical clipping, but still results in a frequency response for high input signal levels that varies with the clipping level. Another problem with this arrangement is that the clipping level for a high variable resistor setting is very sensitive to the output stage bias current; this occurs since the voltage drop across the resistor produced by the bias current will subtract a substantial portion of the total output voltage range which varies with bias current.

In an output stage that drives an inductive load to saturation, such as the output stage of a hearing aid driving a magnetic receiver, the voltage at the output can swing below the lowest supply voltage. Often, for compact size, the output stage is included in a monolithic integrated circuit. In such an integrated circuit, the substrate is connected to the lowest supply voltage, and circuit elements on the integrated circuit are isolated from each other by reverse biased diode junctions between these elements and the substrate. If the voltage on an element swings below the substrate voltage, the normally reverse-biased isolation becomes forward biased, compromising the isolation between circuit elements. What is needed is a compact, efficient circuit to prevent the voltage from swinging substantially below the substrate voltage.

In many cases it is advantageous to limit the output signal level of an electronic system by using an output AGC system. If the AGC system holds the output level below clipping level, much less signal distortion occurs when limiting. In many cases, it is desirable that the output AGC system limit the output signal level to a limiting level selected by adjustment of a power level control while maintaining a constant gain as the power level control is adjusted for signal levels below the limiting level. Also it is advantageous to be able to select either peak clipping or output AGC action by operating a single switch. Furthermore, it is often desirable that the limiting levels for both peak clipping and output AGC be adjusted by a single power level control with the output AGC limiting level being just sufficiently below the peak clipping level to maintain low distortion.

When an output stage is driving a load whose impedance varies substantially with frequency, such as a hearing aid receiver, there may be some frequency regions in which output stage saturation is caused by a limited available output voltage and other frequencies regions in which output stage saturation is caused by a limited available output current. Also, when driving a load, such as a hearing aid receiver, high current levels may cause the receiver itself to produce distortion. For these reasons it is advantageous to have an output AGC system which detects both output stage signal voltage and output stage signal current and combines these detected signals in such a way as to cause the output AGC system to limit the output signal to just sufficiently below these saturation levels to maintain low distortion.

SUMMARY OF THE INVENTION

In a principal aspect the present invention is an improved hearing aid. In another aspect, the present invention is a hearing aid with a four pole adjustable corner state variable filter. According to one feature, the invention is simply a hearing aid having a microphone and receiver with a combination of filters. The filters are, respectively, a four pole adjustable corner lowpass filter, a four pole adjustable corner highpass filter, and an adjustable slope filter.

In another aspect, the present invention is an aid with an adjustable peak clipping circuit located before a fixed gain output stage. Yet still a further aspect is an aid with an adjustable output automatic gain control circuit whose level detector senses the signal level at the input of a fixed gain output stage. Still another aspect is an aid with an auxiliary automatic gain control detector circuit which detects both voltage and current at the output stage.

Another aspect of the present invention is an aid with an input automatic gain control circuit which provides independent adjustment of the compression threshold and compression ratio. A further aspect is an aid with a compansion system around the filter to increase its dynamic range.

In yet another aspect, the present invention is an aid having a control circuit to control the gain of an amplifier. The output of the control circuit is determined by a composite of signals from at least two of the following sources: the detector for the compansion system; the input automatic gain control detector; the output automatic gain control detector; a user-operated volume control; and a fitter-adjusted gain control.

According to another principal aspect, the present invention is a resistorless variable corner frequency state variable filter. The filter includes a sum-difference amplifier, first and second feedback lines, and first and second integrators.

The sum-difference stage receives an input signal as well as signals from the first and second feedback lines. The output of the sum-difference stage is interconnected to the first integrator. The output of the first integrator is interconnected to the first feedback line, thus providing one of the inputs to the sum-difference stage. The output of the first integrator is also interconnected to the second integrator. The output of the second integrator is interconnected to the second feedback line, thus providing another input to the sum-difference stage.

In another aspect of the present invention, the state variable filter includes a control circuit. The control circuit receives an input control signal and responsively provides two control current outputs. A substantially constant ratio is maintained between the two current outputs as the input control signal varies. As a result, the characteristic frequency of the filter may be varied without substantially changing the quality factor of the filter.

In another aspect of the present invention, two 2 pole state variable filters are cascaded. A single control circuit receives an input control signal and responsively provides four control current outputs in appropriate ratios. Substantially constant ratios are maintained between the four current outputs as the input control signal varies. As a result, the characteristic frequency of the filter may be varied without substantially changing the filter shape, i.e. quality factor.

Yet another aspect of the present invention is a regulator for providing a range of reference voltages at an output terminal. This range of voltages is that which, when applied to the input terminals of matched transconductors, will produce a predetermined range of output currents from the transconductors. This regulator can be used, for example, as the control voltage input to the control circuit described above. The regulator includes five transconductors and two amplifiers.

The first and second transconductors are of a first polarity type and provide first and second output currents. The transconductance characteristic of the second transconductor has a first substantially fixed ratio to that of the first transconductor.

The third and fourth transconductors are of a second polarity type and provide third and fourth output currents The transconductance characteristic of the fourth transconductor has a second substantially fixed ratio to that of the third transconductor.

The outputs of the second and third transconductor are connected together and provide the input to the first amplifier. The output of this amplifier is connected to the inputs of the third and fourth transconductors, acting as a feedback signal to force the third output current to be substantially equal to the second output current.

The outputs of the first and fourth transconductor are connected together and provide the input to the second amplifier. The output of this amplifier is connected to the input of the first transconductor, acting as a feedback signal to force the first output current to be substantially equal to the fourth output current.

The fifth transconductor is of the first polarity type. Its transconductance characteristic has a substantially fixed ratio to that of the first transconductor. The input of the fifth transconductor is connected to the output of the second amplifier. The output of the fifth transconductor is connected through the resistance of a potentiometer to the output of the second amplifier. The reference voltage output is taken from the wiper of the potentiometer Another aspect of the present invention is a variable slope filter for receiving an input signal and providing an output signal related to the input signal. The filter includes ,an input terminal, a differential transconductance amplifier, a capacitor, a unity gain differential amplifier, a potentiometer, and a ground line.

The differential transconductance amplifier receives the input signal and a feedback signal from its output and provides an output current. The capacitor is interconnected between the transconductance amplifier output line and the ground line. The unity gain differential amplifier is interconnected to the input terminal and the output of the transconductance amplifier. The unity gain differential amplifier senses difference between the input signal and the transconductance amplifier signal and responsively provides an output signal at its output line.

The potentiometer is interconnected between the transconductance amplifier output line and the unity gain amplifier output line. The output signal from the variable slope filter is taken from the wiper of the potentiometer, which can be adjusted to make the filter either a low pass, high pass or flat response filter.

Another principal aspect of the present invention is an automatic gain control ("AGC") system for receiving an input signal and providing a compressed output signal and providing an adjustable compression threshold and an adjustable compression ratio. The AGC system includes a primary controlled amplifier, a secondary controlled amplifier, a threshold detector, a control circuit, a compression threshold control, and a compression ratio control.

The input signal is applied to the inputs of the primary controlled amplifier and the secondary controlled amplifier. The output of the secondary controlled amplifier is applied to the input of the threshold detector, which detects when the output signal from the secondary controlled amplifier exceeds a predetermined level. The output of the threshold detector is connected to a control circuit.

The control circuit combines the output of the threshold detector with a control signal from the compression threshold control and develops a secondary control signal which is applied to the control input of the secondary controlled amplifier. This forms a feedback system to reduce the gain of the secondary controlled amplifier when the signal level at the output of the secondary controlled amplifier exceeds the threshold level of the threshold detector. This, in turn, occurs at an input level to the secondary controlled amplifier that is established by the control signal from the compression threshold control.

The output of the threshold detector is also applied to the compression ratio control, which provides an adjustable portion of this output as a primary control signal to the control input of the primary controlled amplifier. The output of this amplifier is the compressed output signal from the AGC system.

According to another aspect, the present invention is a differential voltage threshold detector for sensing when the difference between the voltages applied to first and second input terminals exceeds a predetermined threshold. This detector, may be used, for example, in the AGC system just described. The detector includes a differential transconductance stage, first and second "top" current mirrors, first and second "bottom" current mirrors, and a detector.

The differential transconductance stage senses the difference in the voltages at the first and second terminals and issues first and second output currents. The first and second top current mirrors sense these outputs. In response, each top current mirror issues two mirrored signals. Each bottom mirror sense one of the top current mirror signals and responsively provides a bottom current mirror signal.

The detector is interconnected to both of the top and bottom current mirrors. The detector senses when the second current mirror signal from the first top mirror substantially exceeds the signal from the second bottom mirror or when the second signal from the second top mirror substantially exceeds the signal from the first bottom mirror. Such a detection occurs when the voltage applied to the two input terminals varies by more than a predetermined amount. Accordingly, the detector issues an output signal.

In another aspect, the present invention is a bias current compensator. See U.S. Pat.No.4,425,551. This bias current compensator may be used, for example, with the controlled amplifiers used in the AGC system previously described. The bias current compensator prevents bias current changes, caused by a varying control signal, from appearing in the output of the controlled amplifier. The bias current compensator includes a current source, first, second, and third transistors, and a feedback amplifier.

The current source supplies a known multiple of a predetermined collector current in a reference transistor. The emitter of the first transistor is interconnected to the current source and receives the current. The output of the second transistor provides current to the base of the first transistor. The third transistor is interconnected to the second transistor so that the current in the second transistor bears a predetermined relation to the current in the third transistor.

The input to the feedback amplifier is connected to the emitter of the first transistor The output of the feedback amplifier is connected to the inputs of the second and third transistors. By means of this feedback, the base current of the first transistor is controlled so that the emitter current of the first transistor substantially equals that of the input current source.

The output of the third transistor is interconnected to the base of the reference transistor. Thus, by controlling the reference current source, the current supplied by the third transistor to the base of the reference transistor is accurately controlled.

Another aspect of the present invention is a compansion system for increasing the dynamic range of a circuit element that has a limited dynamic range. This system includes a first controlled amplifier, second controlled amplifier, threshold detector, and inverse amplifier.

The first amplifier includes an input signal lead and a control lead. The first controlled amplifier receives the input signal and amplifies the signal according to the signal applied to the control lead. The threshold detector is interconnected to the output of this first amplifier and the input of the "circuit element". It detects when the output of the amplifier exceeds a predetermined level and thus would exceed the dynamic range of the circuit element. When this occurs, the threshold detector provides a control signal to the control lead of the first amplifier to thereby reduce the gain of the first amplifier thereby compressing the range of signal levels at its output.

The second controlled amplifier is interconnected to the output side of the circuit element The second amplifier includes an input lead and a control lead as well. The second amplifier changes its gain in accordance with the control signal provided at its control lead.

The inverse amplifier is connected to the output lead of the threshold detector and receives the control signal that is received by the gain control lead of the first amplifier. The inverse amplifier, however, then inverts the signal and applies it to the control lead of the second controlled amplifier so that the increase in gain of the second controlled amplifier substantially equals the decrease in gain of the first controlled amplifier. The second controlled amplifier thus expands the range of signal levels at its output to substantially compensate for the compression of the range by the first controlled amplifier.

Another aspect of the present invention is a controlled current source for providing an output current substantially exponentially related to a difference between voltages on first and second input terminals and substantially linearly related to an input current applied to a third input terminal. The controlled current source includes first, second, and third transistors.

The controlled current source may be used, for example, to combine control signals from the AGC system and the compansion system described above. In this way, one controlled amplifier may be used instead of two. The first transistor is interconnected to the third input terminal to receive the input current and also is interconnected to the first input terminal to receive the voltage applied to it. The second transistor is interconnected to the first as a feedback stage to regulate the emitter voltage of the first and third transistors.

The third transistor is interconnected to the first transistor as well. The third transistor senses the voltage of the second input terminal and responsively provides an output current.

Another principal aspect of the present invention is a clipper circuit for limiting the predetermined maximum output of an amplifier. It includes first and second amplifiers. The first amplifier has a signal input interconnected to the input terminal and a feedback input interconnected to the output of the second amplifier. It responsively provides a first amplifier output signal.

The second amplifier is interconnected to the first amplifier and responsively provides an output signal. The second amplifier includes a control input and a variable current source. The maximum excursion of the second amplifier is limited by the current supplied to the control input.

The input to the second amplifier may conveniently be connected to a threshold detector to be used for an AGC system whose threshold is directly related to the adjustable clipping level.

In yet another aspect, the present invention is a voltage clamp to prevent a voltage at a node, and particularly a node in an integrated circuit, from becoming substantially negative with respect to a reference node, for example an integrated circuit substrate, and thus causing undesirable circuit operation. The clamp includes a reference voltage source, a voltage sensor, and a voltage supply.

The voltage sensor is interconnected to the node for providing variable conductivity between a voltage supply input and a sense input. The reference voltage source supplies a substantially constant reference voltage to a reference node. The voltage supply supplies the required current through the variable conductivity to the sense node.

GENERAL OBJECTS

A general object of the present invention is an improved hearing aid. Another object is a hearing aid with a wider range of control over its frequency responses. Still another object is a hearing aid with a wider range of control over its output level versus input level characteristics.

A further object of the present invention is a hearing aid with wider dynamic range, lower distortion and more consistent operation that will operate effectively on low supply voltage and is more compact, reliable, economical to use, and less expensive to manufacture.

SPECIFIC OBJECTS

Filters

An additional object of the present invention is a filter whose corner frequency may be varied more easily without changing the shape ("Q") of the frequency response curve of the filter. An additional object is an improved filter whose corner frequency may be so varied by adjusting a single control or "potentiometer".

A still further object is a filter whose corner frequency may be varied more easily by a control signal.

Still a further object is a filter that uses a smaller number of substantially equal value capacitors. Another object is an improved filter using capacitors in which one end of each capacitor is interconnected to a common alternating current ("ac") ground. Another object is a filter that requires no resistors.

Still further object is a filter that allows a low voltage operation from a single cell power source and that uses a lower current drain. Yet a still further object of the present invention is a filter that may be more easily implemented on a semi-custom integrated circuit. Yet a still further object is a filter whose response curve shape is greatly determined by an integer number of substantially identical transistors inter connected in parallel. Another object is a filter that more conveniently provides low pass, band pass and high pass outputs simultaneously.

Yet still an additional object is an improved regulator that:
  More accurately controls current sources, such as, for example, those used to control filter corner frequency;
  Provides an output that can be more easily adjusted over a predetermined range;
  In which a reference current is better established using a single resistor;
  In which the range is more precisely defined by the use of integer numbers of substantially identical transistors in parallel;
  Has lower sensitivity to transistor beta;
  Operates with lower supply voltage;
  Requires less supply current; and
  Is more compact.

An additional object is an improved variable slope filter that:
  Requires just one capacitor having one terminal interconnected to a common "ac" ground and is adjustable from single pole low pass to single pole high pass with an intermediate flat response;
  Requires no resistors other than a potentiometer and provides more accurate control of response;
  Operates with lower voltage, lower current, is more compact;
  Is less expensive to manufacture.

Input AGC

Still an additional object is an input automatic gain control circuit that:
  More accurately controls the compression threshold;
  More accurately controls the compression ratios;
  Allows the compression threshold to be more independently adjustable by a single control;
  Allows the compression ratio to be more independently adjustable by a single control;
  Operates with lower voltage, lower current, is more compact; and
  Is less expensive.

Still an additional object of the present invention is an improved threshold detector that:
  More accurately determines low voltage thresholds; and
  More effectively utilizes a differential input and is inherently a full wave detector.

An additional object is a bias current compensation circuit that operates on lower supply voltage and provides more accurate and reliable operation.

Compansion System

Another object of the present invention is an improved compansion system that:
  More effectively increases dynamic range of other circuit elements;
  More effective uses a single threshold detector (or level detector) and detector filter;
  Provides superior transient characteristics during attack and release;
  Utilizes a low supply voltage and low supply current; and
  Is more compact.

A further object is an improved voltage controlled, exponential current source that:
  Allows gain controlling signals to be combined into a single composite control signal;
  Reduces the number of variable gain amplifiers required; and
  Provides a flexible controlled current source with both linear control input and exponential control input.

Output Limiting

Still further objects of the present invention are as follows:
  An improved adjustable peak clipper with more symmetrical clipping of positive and negative peaks;
  A clipper that allows voltage gain to remain more substantially constant as the clipping level is adjusted;
  A clipper whose clipping level is substantially independent of supply voltage;
  A clipper providing a clipping level not based on junction voltage;
  A clipper that provides an output signal with which a threshold detector may provide an AGC control signal which is related to clipping level;
  A circuit that more easily allows for clipping and/or AGC level established before a fixed gain output stage to provide a constant frequency response as clipping level is adjusted; and
  A circuit that more easily allows the clipping and AGC systems to be used on different kinds of output stages.

Another object is an output stage with AGC detectors that more accurately detect both output voltage and output current so that maximum output may be limited by AGC to below the voltage and current levels which would produce distortion either in the output stage or the load.

An additional object is an improved voltage clamp that prevents voltage swings (with an inductive load) from going substantially below the substrate voltage of an integrated circuit which would disturb operation.

These and other objects of the present invention will be more fully understood by reference to the following detailed description of the preferred embodiments. dr

BRIEF DESCRIPTION OF THE DRAWING

Preferred embodiments of the present invention are described herein with reference to the drawing wherein.

General Circuit

Sub-Systems

Figure 1:
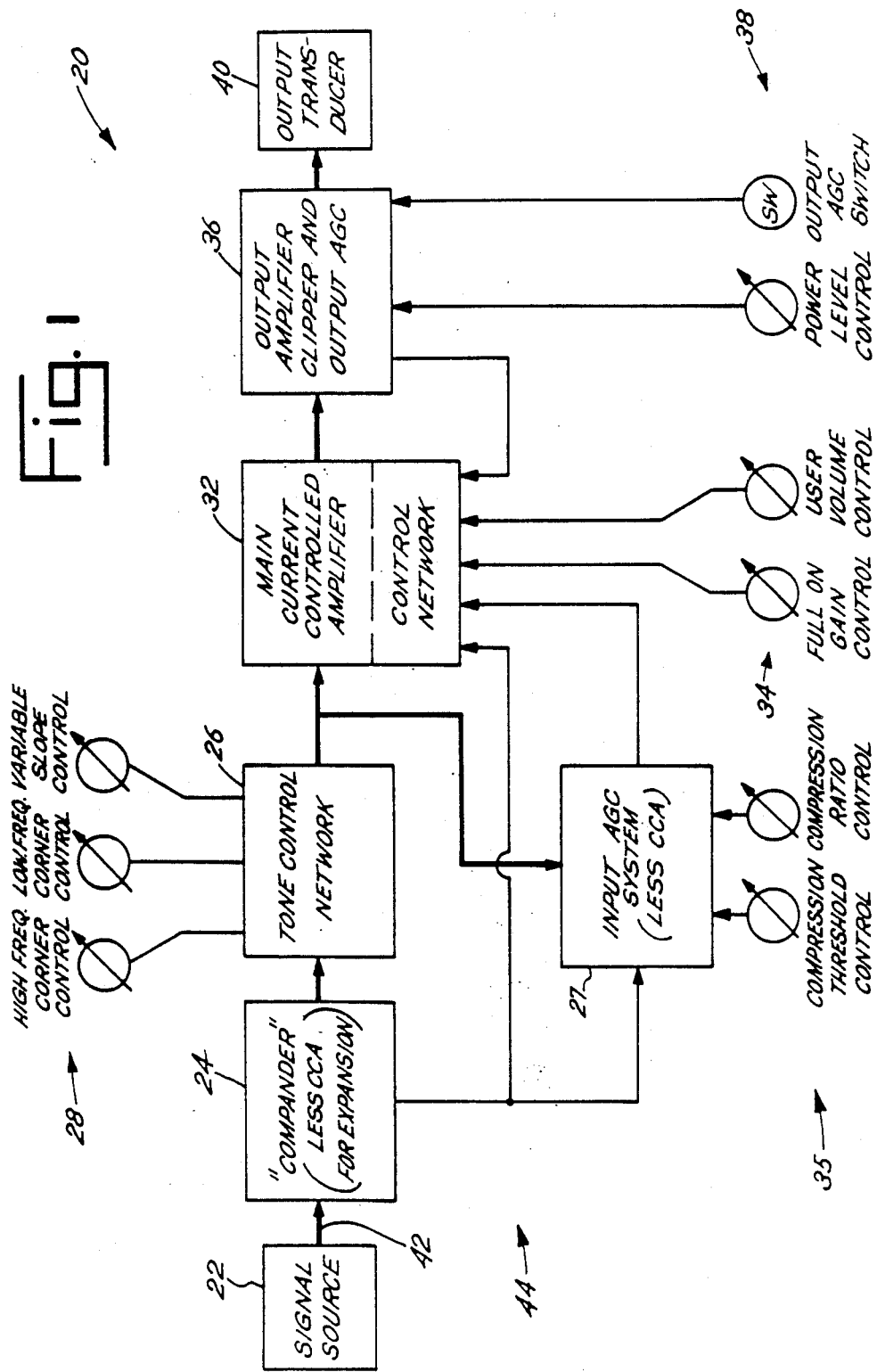
FIG. 1 is a block diagram of the preferred embodiment of the hearing aid of the present invention.
Figure 3:
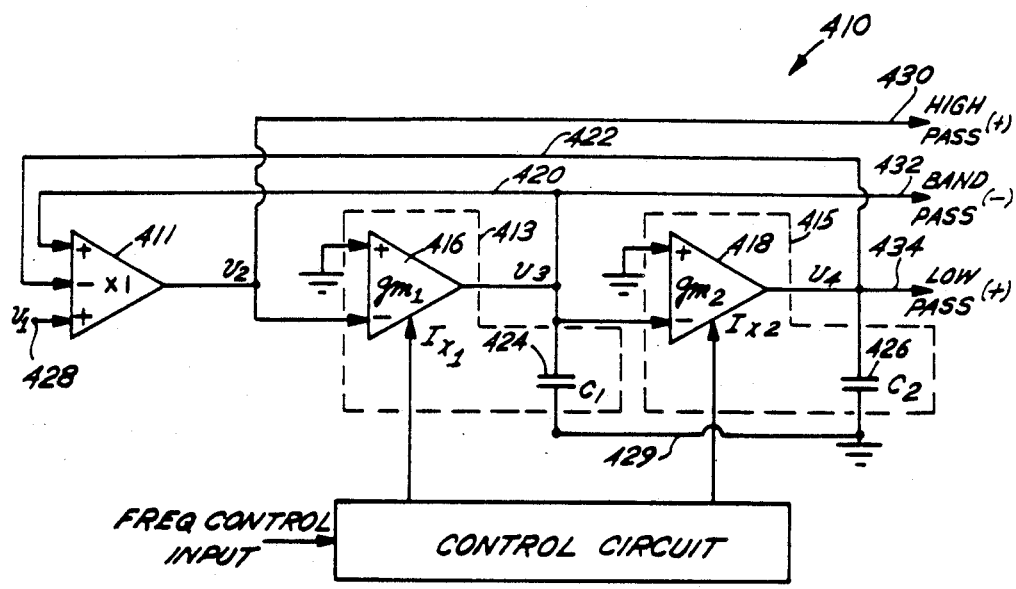
Figure 4:
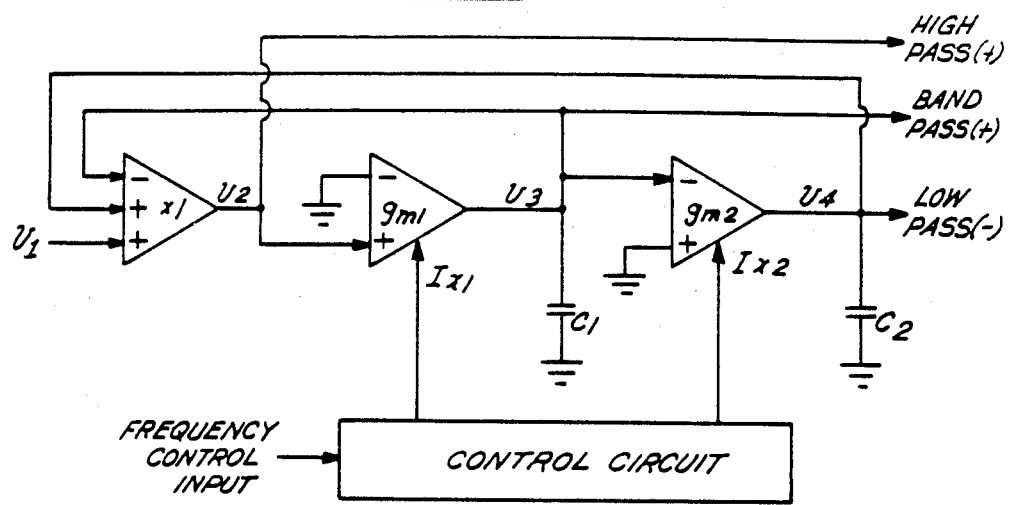
Figure 5:
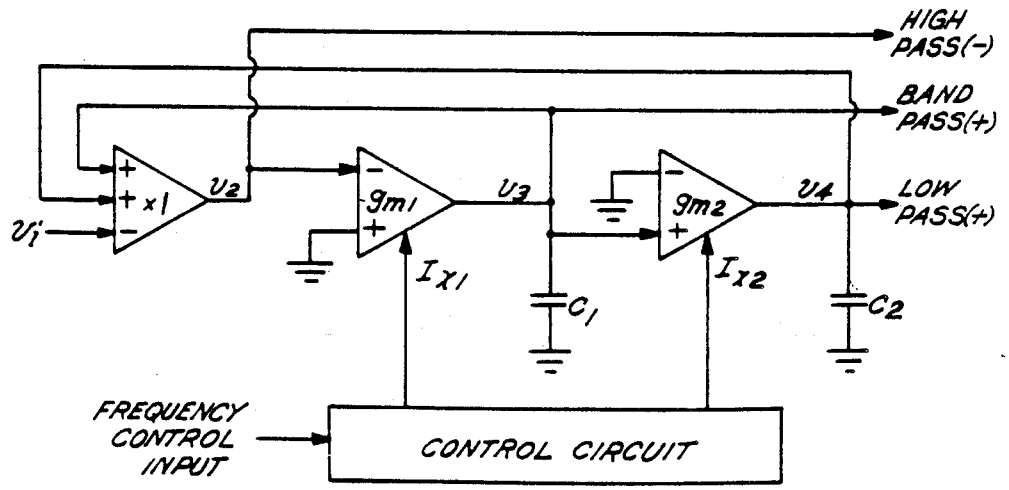
Figure 9:
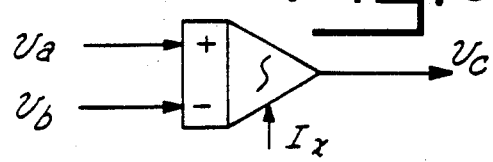
Figure 10:
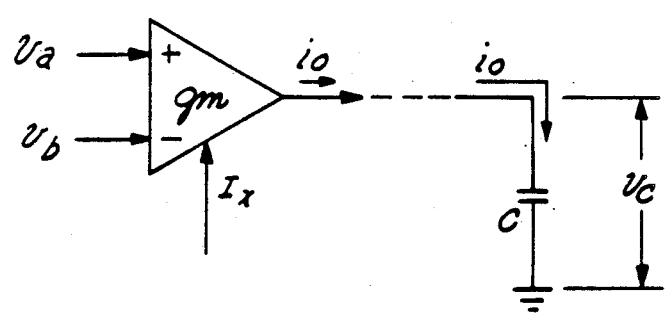
Figure 11:
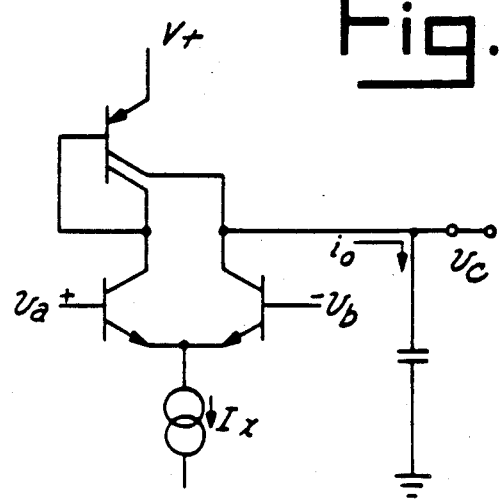
Figure 12:
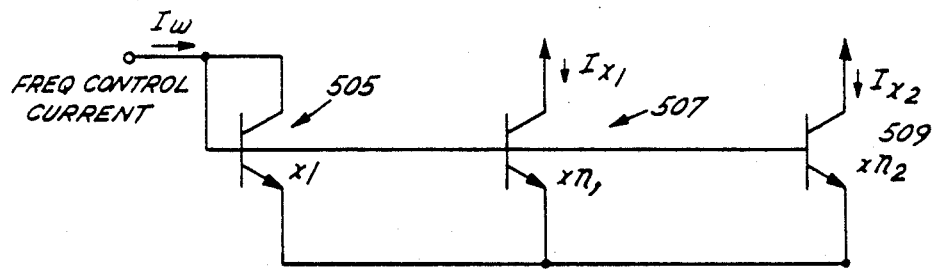
Figure 12A:
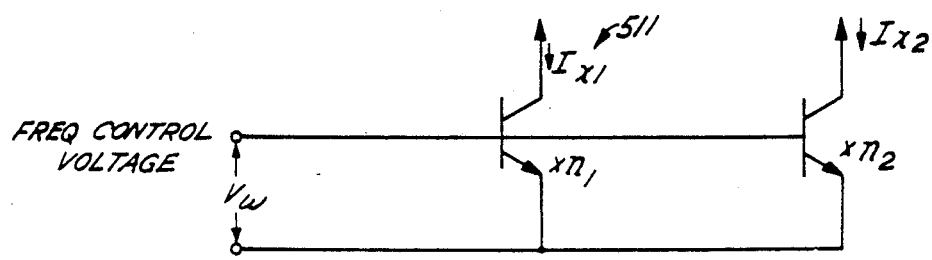
Figure 13:
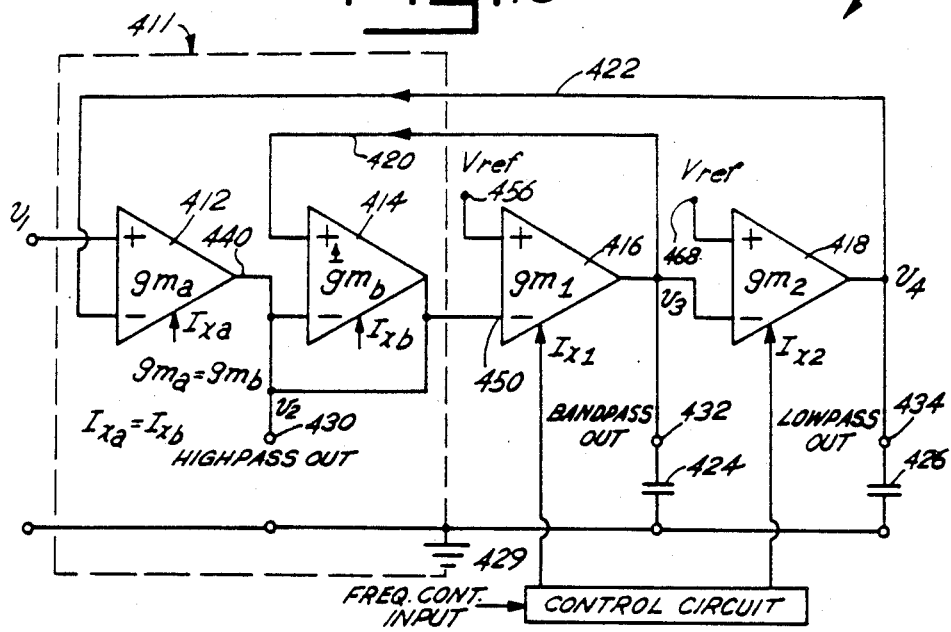
Figure 14:
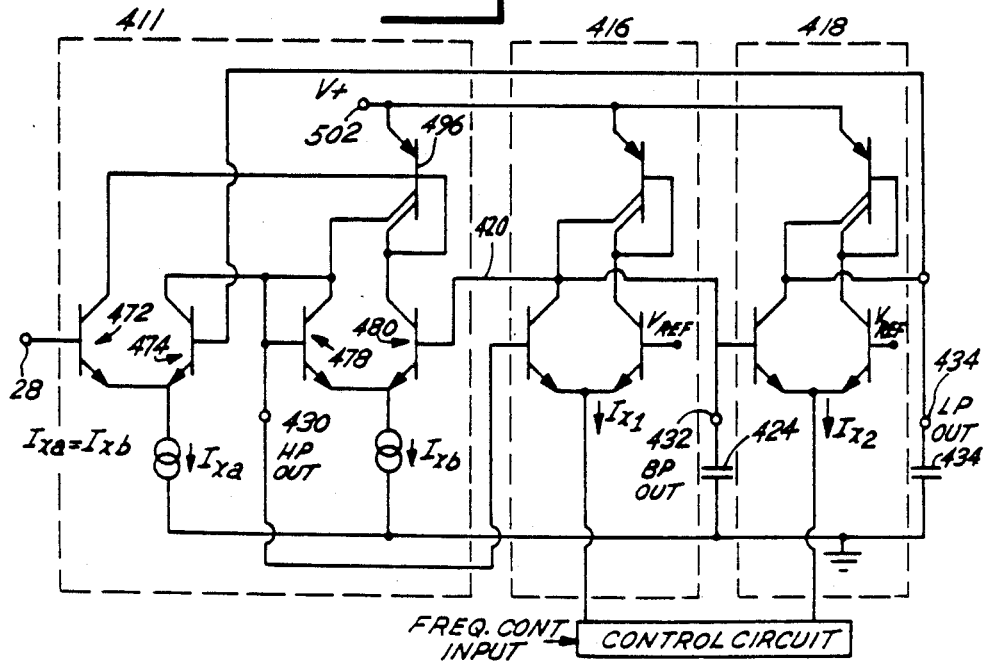
Figure 15:
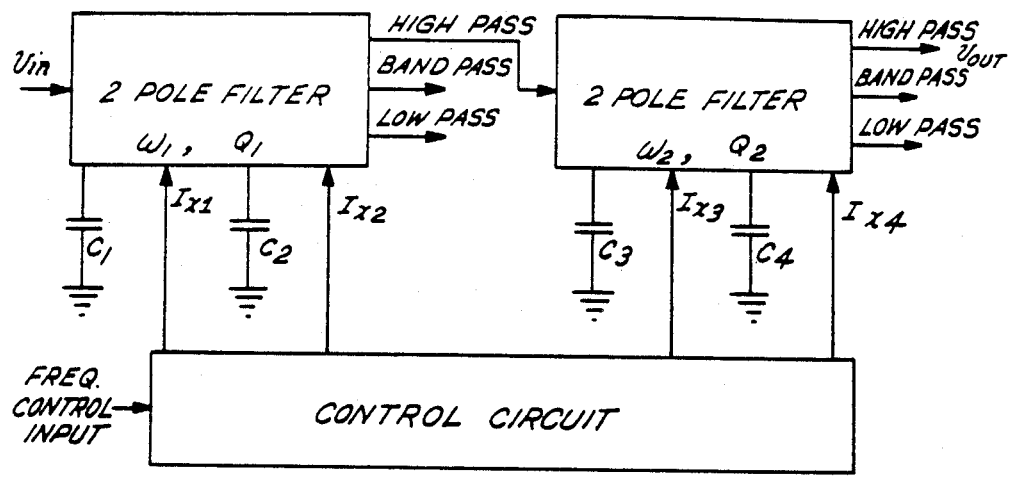
Figure 16:
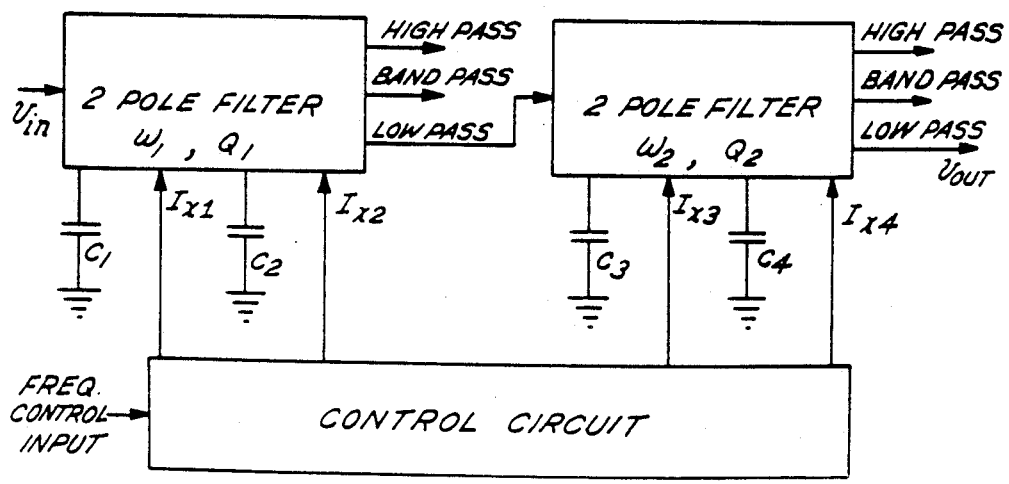
Figure 17:
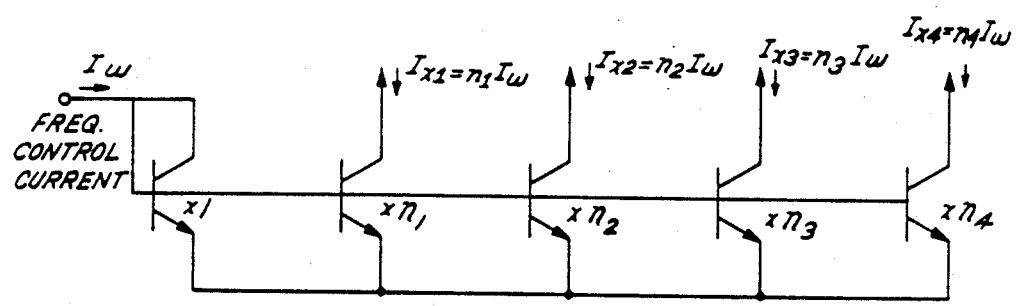
Figure 18:
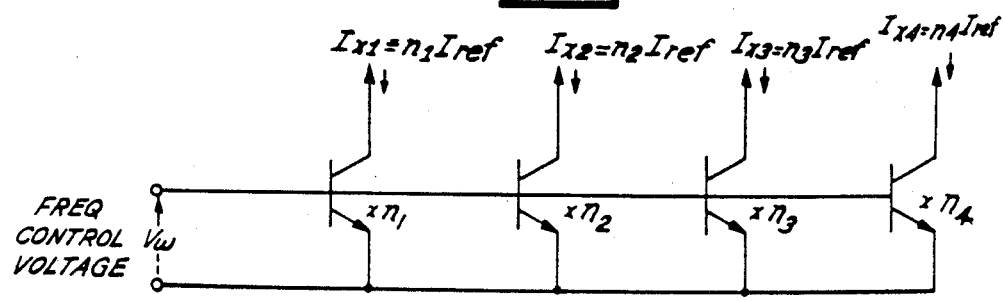
Figure 19:
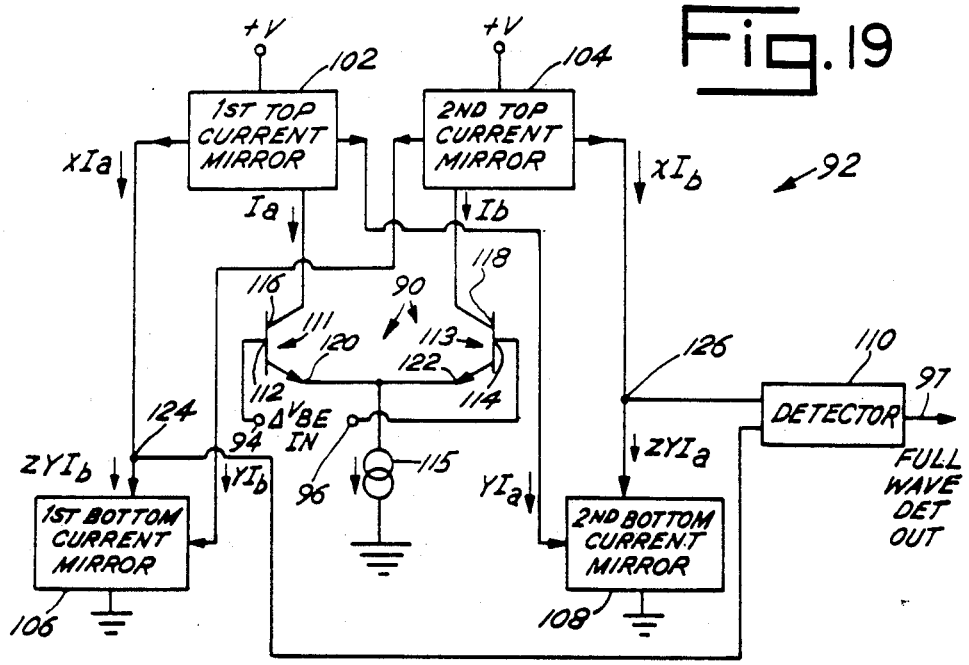
Figure 20:
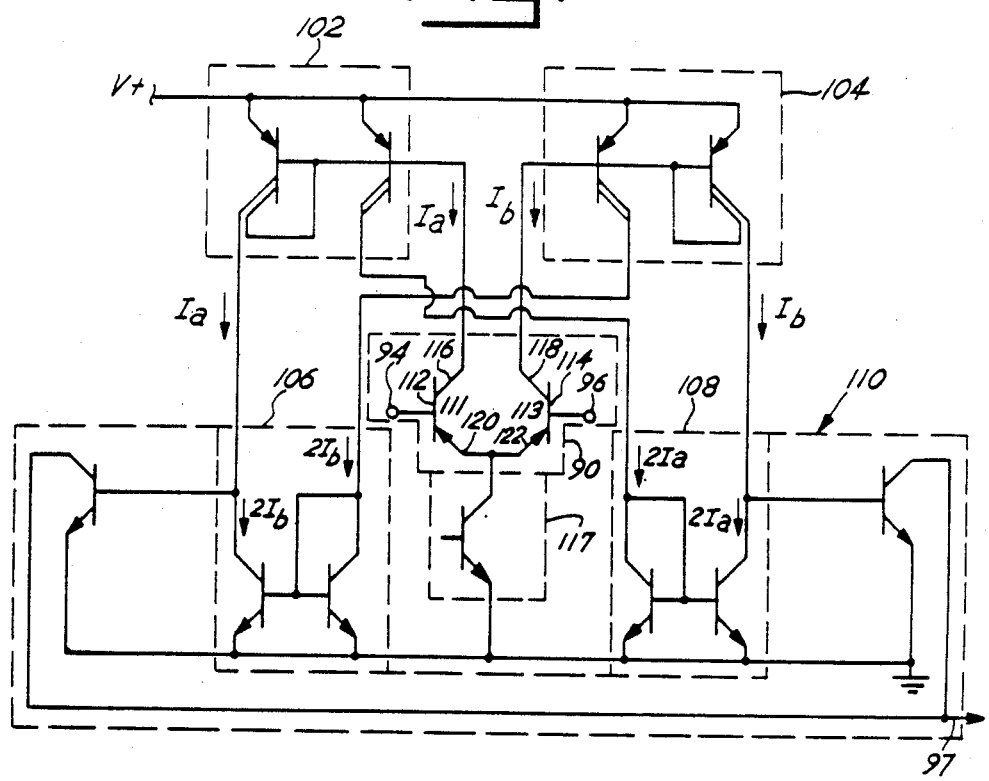

FIG. 3. is a block diagram of an adjustable state variable filter for the preferred embodiment shown in FIG. 1;

FIG. 4. is a block diagram of an adjustable state variable filter, showing an alternative embodiment of the filter shown in FIG. 3;

FIG. 5 is a block diagram of an adjustable state variable filter, showing another alternative embodiment of the filter shown in FIG. 3;

FIG. 6 is a symbolic representation of the unity gain sum/difference amplifier used in the preferred embodiment of the filter shown in FIG. 3;

FIG. 7 is a schematic diagram of the unity gain sum/difference amplifier used in the preferred embodiment shown in FIG. 3;

FIG. 8 is a more detailed schematic diagram of the unity gain sum/difference amplifier used in the preferred embodiment shown in FIG. 3;

FIG. 9 is a symbolic representation of the integrator used in the preferred embodiment shown in FIG. 3;

FIG. 10 is a schematic diagram of the integrator used in the preferred embodiment shown in FIG. 3;

FIG. 11 is a more detailed schematic diagram of the integrator used in the preferred embodiment shown in FIG. 3;

FIG. 12 is a schematic diagram of the control circuit used in the preferred embodiment shown in FIG. 3;

FIG. 12a is a schematic diagram of a control circuit showing an alternative embodiment of the control circuit shown in FIG. 12;

FIG. 13 is a schematic diagram of the filter shown in FIG. 3;

FIG. 14 is a more detailed schematic diagram of the filter shown in FIG. 3;

FIG. 15 is a block diagram showing how the two pole filter shown in the preferred embodiment of FIG. 3 may be used to make a four pole high pass filter;

FIG. 16 is a block diagram showing how the two pole filter shown in FIG. 3 may be used to make a four pole low pass filter;

FIG. 17 is a schematic diagram of a control circuit used in the preferred embodiment shown in FIG. 15;

FIG. 18 is a schematic diagram of a control circuit showing an alternative embodiment of the circuit shown in FIG. 17;

FIG. 19 is a schematic diagram of the differential threshold detector for the preferred embodiment shown in FIG. 1;

FIG. 20 is a more detailed schematic diagram of the differential threshold detector shown in FIG. 19.

Figure 21:
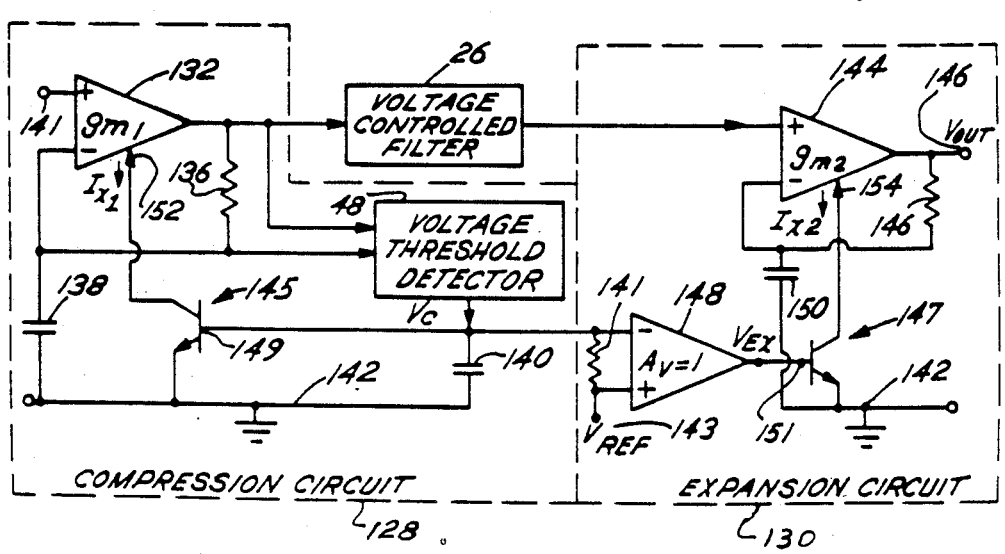
Figure 22:
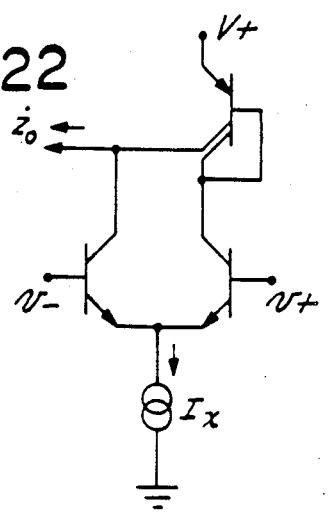
Figure 23:
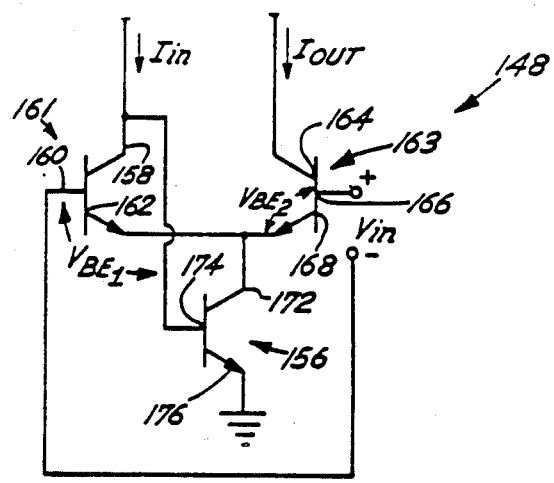
Figure 24A:
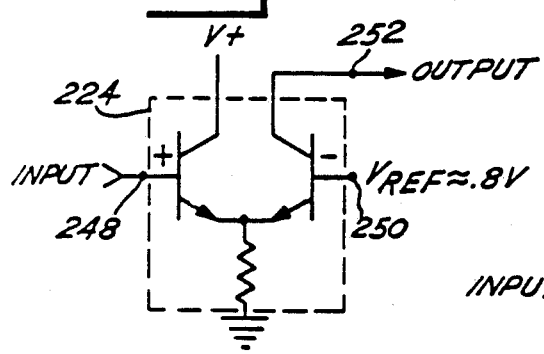
Figure 24B:
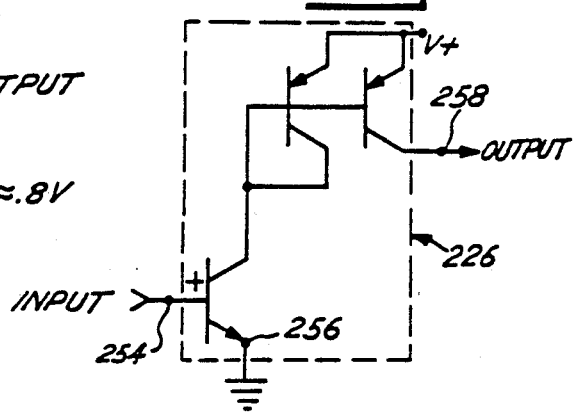
Figure 25:
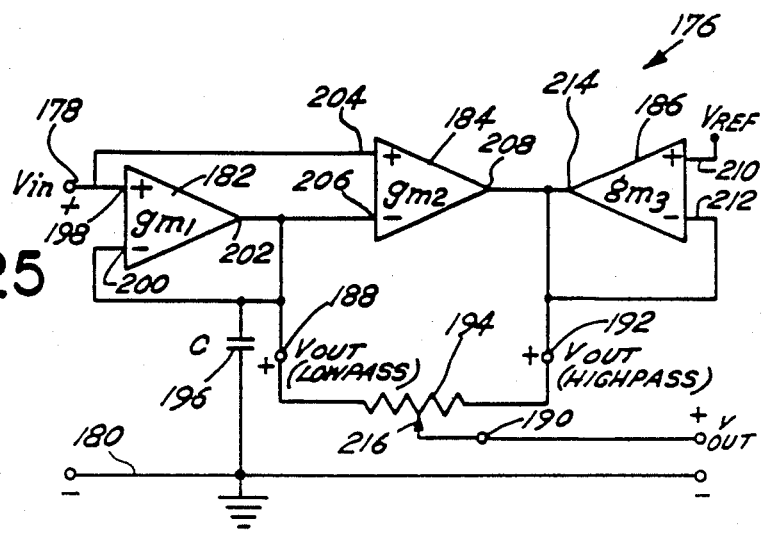
Figure 24:
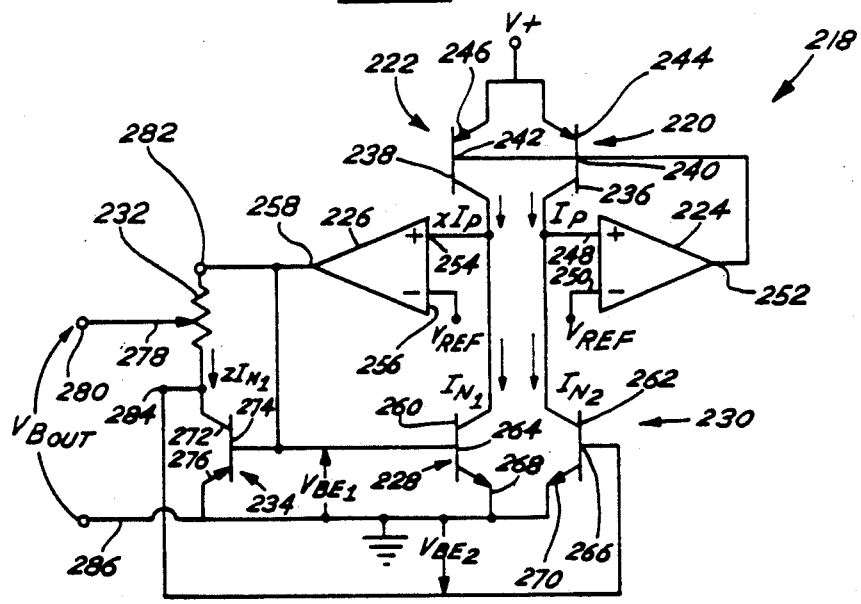
Figure 26:
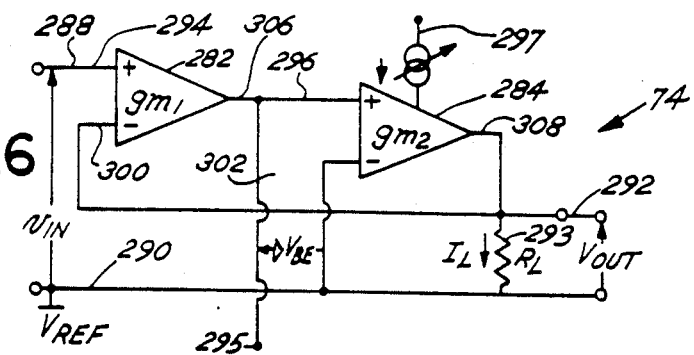
Figure 27:
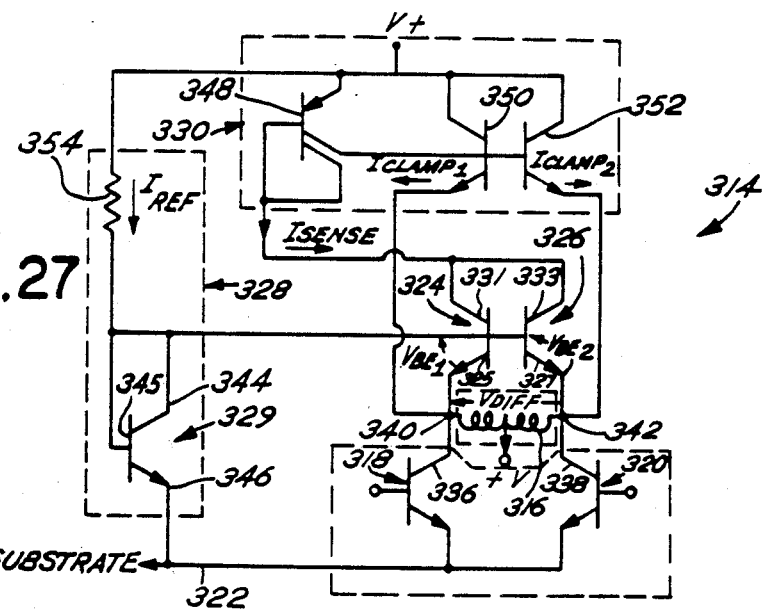
Figure 28:
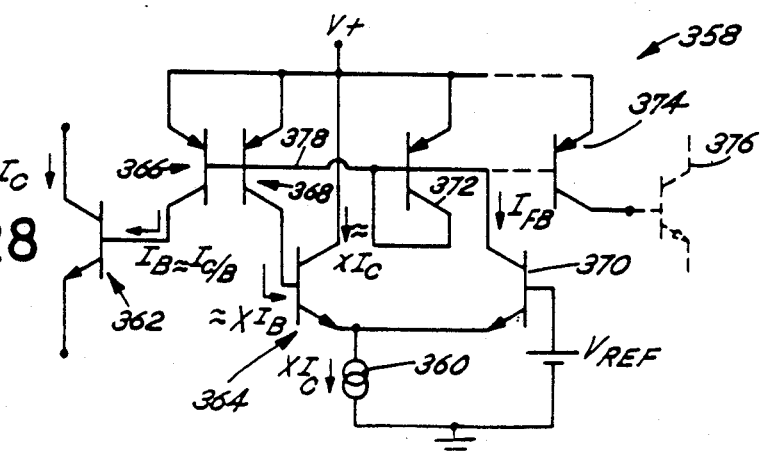
Figure 29:
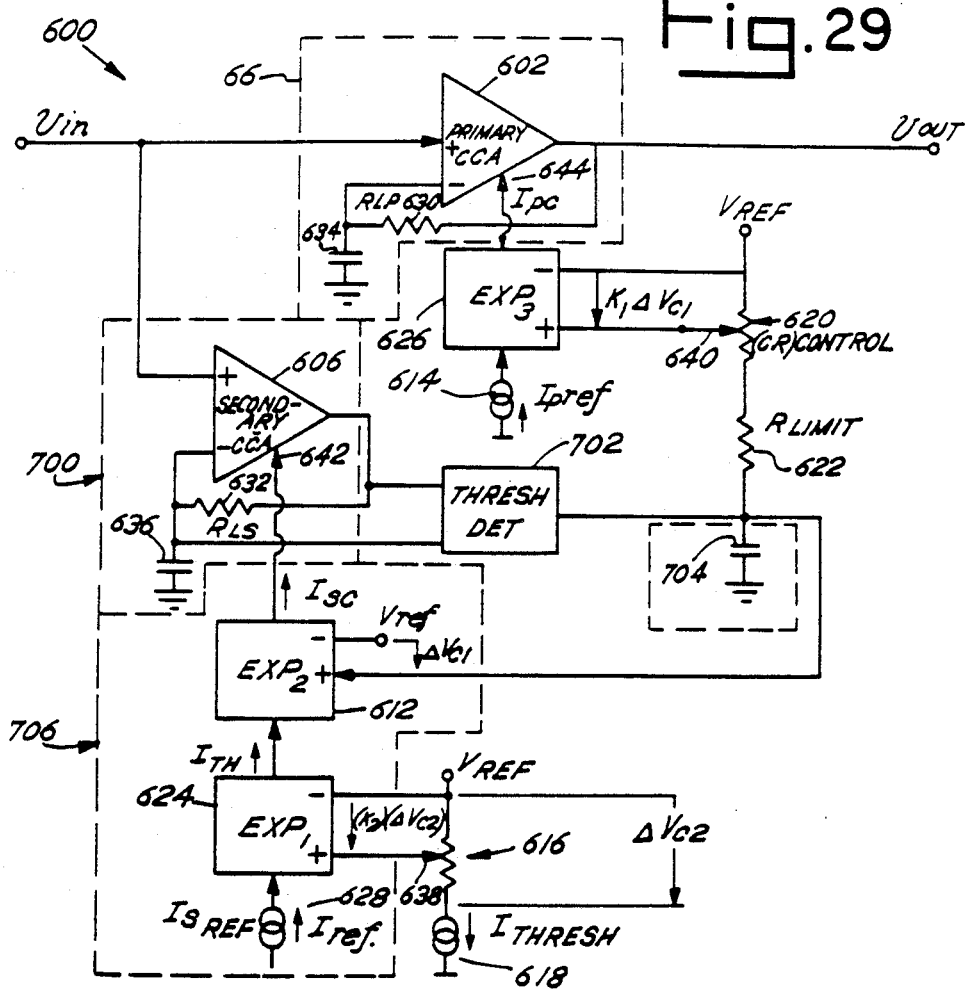
Figure 30:
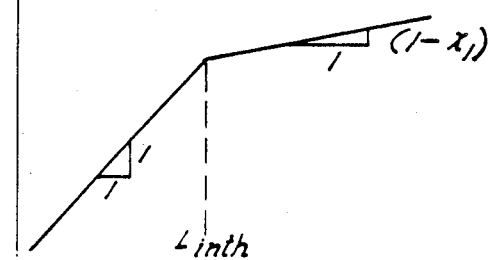

FIG. 21 is a schematic diagram of the system for increasing dynamic range for the preferred embodiment shown in FIG. 1;

FIG. 22 is a schematic diagram of an operational transconductance amplifier, as used with the preferred embodiment shown in FIG. 1;

FIG. 23 is a schematic diagram of the controlled current source for the preferred embodiment shown FIG. 1;

FIG. 24 is a schematic diagram of the regulator for the preferred embodiment shown in FIG. 1;

FIG. 24a is a schematic diagram of a first amplifier used in the regulator shown in FIG. 24;

FIG. 24b is a schematic diagram of a second amplifier used in the regulator shown in FIG. 24;

FIG. 25 is a schematic diagram of the variable slope filter for the preferred embodiment shown in FIG. 1;

FIG. 26 is a schematic diagram of the clipper circuit for the preferred embodiment shown in FIG. 1;

FIG. 27 is a schematic diagram of the voltage clamp for the preferred embodiment shown in FIG. 1;

FIG. 28 is a schematic diagram of the bias current compensation circuit for the preferred embodiment shown in FIG. 1;

FIG. 29 is a block diagram of the input automatic gain control system for the preferred embodiment shown in FIG. 1; and FIG. 30 is a graph demonstrating the effect of the automatic gain control system of FIG. 29.

DETAILED DESCRIPTION OF THE PREFERRED EMBODIMENTS

General System Description

Referring to FIGS. 1-30, the preferred embodiment of the present invention is shown as an improved hearing aid circuit, generally designated 20. Significantly, many of the circuits described herein may be used in a variety of different applications. However, the most preferred embodiment of the present invention relates to hearing aids. Thus, the invention has been described in the context of hearing aids.

As shown more clearly in FIG. 1, a hearing aid (not shown) includes a signal source or microphone 22, a "compander" 24, a filter or "tone control network" 26 and related external controls 28, an input Automatic Gain Control ("AGC") system 27 and related external controls 35, a main current controlled amplifier ("CCA") 32 and related external controls 34, an output signal processor 36 and related external controls 38, and a receiver or output transducer 40.

In several figures, dotted lines are drawn about selected circuit components. Such groupings of circuit components has been made somewhat arbitrarily and only as an aid to the reader in understanding the present invention.

Figure 2:
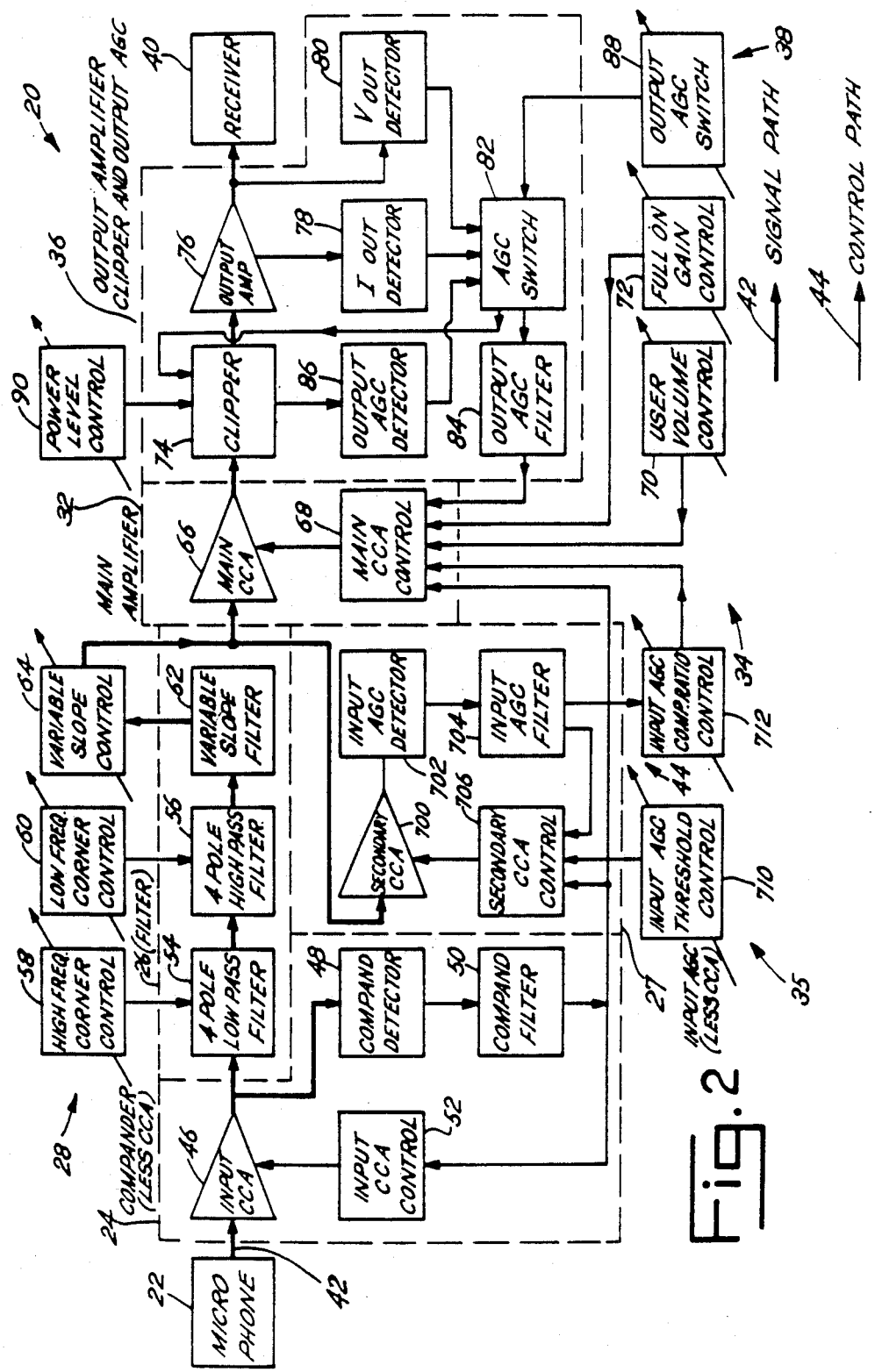
FIG. 2 is a more detailed block diagram of the preferred embodiment of the hearing aid shown in FIG. 1.

As shown in FIGS. 1 and 2, the microphone 22 receives sound signals in the air and responsively transmits an electrical signal along a signal path 42, represented as heavy lines in FIGS. 1 and 2. Certain circuit components affect the electric signal indirectly, by affecting the operation of circuit components, rather than the actual signal itself. The signals from such components are sent via control paths, which are represented by the lighter lines 44 shown in FIGS. 1 and 2.

Electrical signals generated by the microphone 22 have relatively small amplitude and are received by the compander 24. The compander 24 includes input current controlled amplifier 46, a "compand" detector 48, a "compand" filter 50, and an input current controlled amplifier control 52 to vary the gain of the current controlled amplifier 46.

The current controlled amplifier 46 simply increases the amplitude of the microphone signal in a predetermined manner for processing by the rest of the hearing aid circuit 20. The "compand" detector 48 senses when the output of the current controlled amplifier 46 exceeds a predetermined level, outside of the dynamic range of the filter 26.

When the "compand" detector 48 senses such a large signal from the current controlled amplifier 46, it sends a signal to "compand" filter 50. The "compand" filter 50 issues a smoothed compand detector signal, which is received by both the current controlled amplifier control 52 the main CCA control 68 and the secondary CCA control 706. The input current controlled amplifier control 52 then reduces a controlling current which it supplies to the input current controlled amplifier 46 to decrease the amount of amplification exerted by the amplifier 46.

The controlling current from the input current controlled amplifier control 52 is exponentially related to the amplitude of the signal received from the "compand" filter 50. The controlling current received by the main CCA 60 is inversely related to the controlling current to the input CCA 46. The gain of the main CCA 66 is thus inversely related to the gain of the input CCA 46. In this way, the gain through the system is constant, but the filters in the tone control network 26 operate over a narrower dynamic range of signal levels.

The output of the current controlled amplifier 46 is received by the tone control network 26. The tone control network 26 includes a four pole lowpass filter 54, which presents a signal to a four pole highpass filter 56. The two filters 54, 56 are controlled, respectively, by the potentiometers, or controls 58, 60. The settings of the potentiometers 58, 60 determine the frequency at which the low pass and high pass filters 54, 56 will start substantially influencing the signal received.

A signal from the lowpass and highpass filters 54, 56 is transfered to the variable slope filter 62, which further shapes the frequency spectrum of the signal. The variable slope filter 62 presents two signals to a variable slope control 64, which may be adjusted to further attenuate high frequency signals, low frequency signals, or to pass all frequencies equally.

The variable slope control 64 provides a signal to the input AGC circuit 27 and the main amplifier 32. The main amplifier 32 includes the main current controlled amplifier 66 and the main current controlled amplifier control 68. Two external adjustments, a user operated volume control 70 and a full on gain control 72, are interconnected to the main current controlled amplifier control 68. Control 68 also receives inputs from the compander 24, the output signal processor 36, and the input AGC system, 27, which are used to control the gain of the main current controlled amplifier 66.

Thus, when the compander 24 is operating, it sends a signal to the main current controlled amplifier control 68 so that the input to the main amplifier 32 is expanded to the same degree that it was compressed by the input current controlled amplifier 46.

The level of gain that the main current controlled amplifier 66 exhibits is determined, in part, by the inputs to the control 68, including the setting of the user operated volume control 70. The maximum gain obtainable with the user operated volume control 70 full on is established in part by the setting of the full on gain control 72.

The input AGC system 27 includes a secondary CCA 700, an AGC Detector 702, AGC filter 704, secondary CCA control 706, and associated external controls 35 including the AGC threshold control 710 and AGC CR (compression ratio control) 712. In addition the system uses portions of the main amplifier 32, including the main CCA 66 and a portion of the main CCA control 68.

The input AGC system uses a feedback system to establish the control signal, and this control signal is fed forward to the main CCA 66. The secondary CCA 700 amplifies the signal from the variable slope control 64 and sends this amplified signal to the AGC detector 702. The AGC detector 702 senses when the output of the secondary CCA 700 exceeds a predetermined level, called the AGC detector threshold level.

When the AGC detector 702 is triggered by an input reaching or exceeding the threshold level, it sends a signal to the AGC filter 704 which issues a smoothed AGC detector signal (called $V_{cl}$), which is received by the secondary CCA control 706. The secondary CCA control 706 supplies a control current to the secondary CCA 700 to control its gain. This control current is controlled by both the smoothed detector signal ($V_{cl}$) and an external control, the AGC threshold control 710. The detector signal($V_{cl}$) causes the control current to be reduced, which reduces the gain of the secondary CCA 700 such that its output signal amplitude does not substantially exceed the AGC detector threshold level.

The signal level from the microphone required to trigger the AGC detector 702 is called the input AGC threshold. The AGC threshold control 710 also varies the gain of the secondary CCA 700 so as to vary the input AGC threshold.

The secondary CCA control 706 also receives an inverse controlling signal from the compand filter 50 to expand the previously compressed signal which is present at the variable slope control 64 output. In this way the compansion action will not influence the detector signal $V_{cl}$ and the compander will not be "seen" by the input AGC system.

If this smoothed detector signal ($V_{cl}$) is applied to the main CCA control 68, the result would, be an AGC system with a very high non-variable compression ratio (CR) above the AGC threshold. To provide variable slope compression, the detector signal ($V_{cl}$) from the AGC filter 704 is passed through a variable control, the AGC CR control 712. The AGC CR control 712 can provide an adjustable portion of the detector signal to the main CCA control 68, which controls the gain of main CCA 66. Thus, for input levels above the AGC threshold, the amount of gain reduction which the input AGC system exerts on main CCA 66 is variable by means of the AGC CR control 712, thereby varying the slope of the input-output curve above the threshold.

The output of the main current controlled amplifier 66 is received by the output signal processor 36. The output signal processor 36 includes a clipper 74, output amplifier 76, output current detector 78, voltage output detector 80, AGC detector 86, internal automatic gain control switch 82, and AGC filter 84. An external AGC switch 88 and a power level control 90 are interconnected to the output signal processor 36.

The clipper 74 prevents any signal received from the main current controlled amplifier 66 from exceeding a certain predetermined output level set by the power level control 90. The output of the clipper 74 is sent to the output amplifier 76, and a secondary output is sensed by the automatic gain control detector 86.

The output amplifier 76 further increases the signal received from the clipper 74, before it is sent to the receiver 40. Current and voltage detectors 78, 80 sense the output current and voltage and provide output signals to the AGC switch 82 when either the output current or the output voltage exceeds a respective predetermined level.

The automatic gain control switch 82 may be switched on with the external AGC switch 88. Signals from the current and/or voltage detectors 78, 80, or from the automatic gain control detector 86 signify that the output of the circuit 20 is too large. Such signals are thus transmitted to the automatic gain control filter 84, which smooths and combines these signals and feeds them back to the main current controlled amplifier control 68 to reduce the amount of gain which the main current controlled amplifier 66 is then providing.

A signal from the output amplifier 76 is applied to the receiver 40, which converts the electrical signal to sound. This sound is then heard by the wearer of the hearing aid.

System Architecture

Much of the advantages of the present system arise from the architecture or placement of the various components. In particular, a compression circuit and an expansion circuit are placed on opposite sides of the voltage controlled filters to increase the dynamic range of the system. See FIG. 21. Moreover, the adjustable peak clipping circuit or clipper 74 is positioned before the fixed gain output stage or output amp 76. As a result, the previously mentioned design problems of providing adjustable clipping at the output of the output stage, such as asymmetrical clipping and sensitivity to output stage bias current, are avoided.

In addition, the adjustable output automatic gain control circuit is located before the fixed gain output stage. As a result, the output automatic gain control may be connected to the clipper 74 to allow the power level control 90 to determine the output limiting level in both AGC and non-AGC modes. In addition, the auxiliary automatic gain control uses both output voltage and output current detection systems 80, 78 at the output stage.

By adding a fixed amplitude detection system at the output of the output stage, a greater undistorted maximum output level from the output stage during use of the output automatic gain control may be safely designed for. This is because the tolerances of the detection level occuring at the input of the output stage as well as the output stage gain do not require that the detection level be set lower to prevent possible clipping in the output stage when the output level control is set to maximum. Instead, the detection level may be set high enough to substantially guarantee full use of the output amplifier's amplitude capability and the fixed amplitude detection at the output of the output stage will override the detection at the input of the output stage when the output level control is set to maximum.

The output voltage detection simply triggers the output automatic gain control if the collector to emitter voltage of the output stage transistors nears saturation, thus preventing clipping and resultant distortion.

The output current detection monitors the current delivered to the receiver and also triggers the output automatic gain control if a predetermined current limit is exceeded. This has a major advantage in the preferred embodiment which is a high power hearing aid. The current state of the art in receiver design produces receivers with widely fluctuating impedance versus frequency which, at some frequencies, can drop very low compared to the average impedance value. When driven by an amplifier capable of driving the receiver to maximum levels where the receiver exhibits nominal impedance, the receiver may draw excessive current from the amplifier at frequencies where receiver impedance is much lower, either exceeding the receiver's s own current limits for low distortion operation or possibly the amplifier's linear operation region, which could also increase distortion. Thus, having both current and voltage detection utilizes the maximum output capability of the amplifier-receiver system across the frequency range of the system.

In addition, the input automatic gain control circuit uses independent adjustment of the compression threshold and compression ratio and allows for precise adjustment of each of these factors without interaction between the adjustments.

In addition, level detection for the input automatic gain control circuit is located after the tone (or frequency shaping) control 26, but still before the gain control. Applicants have found that such an arrangement provides a more desired signal, since the AGC system is operating on the signal eventually supplied to the receiver and "heard" by the wearer of the aid 20. In other arrangements, the AGC system may operate on signals not yet shaped by the filter, or tone control.

Normally, it is desired that selected frequencies of sound signals not passed by the filter, and thus not intended to be amplified by the aid, should not affect the operation of the aid. Since the AGC system of the present invention does not operate on such signals, since they may be effectively attenuated by the filter, such extraneous noise will not significantly influence the operation of the AGC system.

Thus, for example, the filter may be adjusted such that low frequency signals, such as the low frequency sounds emitted by heavy machinery, will be substantially attenuated by the filter. If the AGC level detection occurs before the filter, these signals could cause the AGC system to respond and reduce the gain for higher frequency desired signals. However, the present AGC would not respond to these low frequency signals when they are outside of the filter pass band.

Moreover, the main current controlled amplifier uses a control signal which is a composite of signals. The composite of signals is derived from a plurality of inputs from different sections of the aid. The signal is comprised of the signal from the compander 24, the input AGC system 27, the output signal processor 36, the user-operated volume control 70, and the full-on gain control 72. By using such a composite of signals, a single current controlled amplifier 66, rather than a series of amplifiers, may be used. This reduces the noise generated and complexity of the circuit, as well as allowing the circuit to be made more cheaply.

The hearing aid circuit 20 is comprised of different, smaller circuits. Several of these smaller circuits for the overall hearing aid circuit 20 are individually discussed in detail in separate sections below

Adjustable State Variable Filter

Referring to FIGS. 3-14, one aspect of the present invention is an improved adjustable two pole state variable filter generally designated 410. The filter, as shown in FIG. 3, includes a unity gain sum-difference amplifier 411, first and second variable integrators 413, 415, each including a capacitor loaded operational transconductance amplifier ("OTA") 416, 418, loaded, respectively, by capacitors 424, 426, first and second feedback lines 420, 422, an input terminal 428, and ground line 429, and highpass, bandpass, and lowpass output terminals 430, 432, 434.

The input signal from the input terminal has a positive input to the sum-difference amplifier 411. The first feedback line 420 has a second positive input and the second feedback line 422 has a negative input. The output of the sum-difference amplifier 411 in conjunction with the rest of the circuit 410 results in the highpass signal at the output of the sum-difference amplifier 411.

The output of the amplifier 411 is interconnected to the highpass output terminal 430. The output is also interconnected to the negative input of the first integrator 413. The first integrator 413 receives the highpass signal and responsively provides at its output a first integrated signal which corresponds to a bandpass signal and which is interconnected to the bandpass output terminal 432. It also provides this signal to the first feedback line 420 to provide one of the positive inputs to the sum-difference amplifier.

The output of the first integrator 413 is also supplied as an input to the second integrator 415. The second integrator 415 responsively provides an output which is provided to the output lowpass terminal 434 and the second feedback line 422. The second feedback line 422, of course, provides a negative input to the sum-difference amplifier 411.

The operation of an ideal OTA is given by the following formula:

$$g_m = h(I_x)$$

where $g_m$ is the transconductance (or gain) of the OTA, h is a constant of a particular OTA, and $I_x$ is the control current supplied to the OTA. Output current of the OTA is provided by the following equation:

$$i_{output} = g_m[(v+) - (v-)]$$

where I output is the output current and v+ and v− are, respectively, the positive and negative voltages applied to the differential inputs of the OTA. A simple OTA realization using bipolar transistors is shown in FIG. 22. For this configuration, which includes a differential transistor pair with a current mirror load and a current source $I_x$ supplying an emitter current for the differential pair, $g_m = I_x/2V_T$, where $V_T$ is the volt equivalent of temperature $= kT/q_e$. See, e.g., R. Gray & R. Meyer, Analysis and Design of Analog Integrated Circuits (John Wiley & Sons 1977).

An equation is often provided for a filter to indicate how the output signal of the filter is related to any input signal applied to the filter. Such equations are known as "transfer functions". Generally, the steeper the slope of the attenuation versus frequency curve of the signal beyond the corner frequency, the more "poles" of the transfer function describing the filter. Poles define situations in which the denominator of the theoretical transfer function substantially reaches zero for a given input signal frequency.

Equations describing the outputs for the circuit shown in FIG. 3 are listed below:

Unity Gain
Sum/Difference Amplifier: $v_2 = v_1 + v_3 - v_4$
Variable Integrators: $v_3 = -(g_{m1}/jwC_1)v_2$
$v_4 = (g_{m2}/jwC_2)v_3$ where $j = \sqrt{-1}$ and $w = 2\pi$ times the signal frequency.

High Pass: $\dfrac{v_2}{v_1} = \dfrac{-w^2}{W_o^2 - w^2 + (jw)(w_o)/Q}$

-continued

Band Pass: $v_3/v_1 = \dfrac{-(jW)(W_o)}{W_o^2 - W^2 + (jW)(W_o)/Q}$

Low Pass: $v_4/v_1 = \dfrac{W_o^2}{W_o^2 - W^2 + (jW)(W_o)/Q}$ where $W_o = \sqrt{\dfrac{g_{m1} g_{m2}}{C_1 C_2}}$ ; $Q = \sqrt{\dfrac{g_{m2}}{g_{m1}} \dfrac{C_1}{C_2}}$ $W_o$ is known as the characteristic frequency; Q is known as the quality factor (or the inverse of the damping factor).

$g_{m1} = h\, I_{x1}$ ; and $g_{m2} = h I_{x2}$ where, again, h is a constant for a particular transconductance amplifier.

If we make $C_1 = C_2 = C$ then $$W_o = (h/c)\sqrt{I_{x1} I_{x2}} \text{ and } Q = \sqrt{I_{x2}/I_{x1}}$$

The present invention may be made substantially without the use of resistors using a minimal number of components. Moreover, the characteristic frequency and quality factor of the filter may be altered by changing the magnitudes of and ratio between $I_{x1}$ and $I_{x2}$, which set the transconductances of the first and second OTAs 416, 418.

Of course, the present invention may be implemented with embodiments other than that shown in FIG. 3. Thus, other, exemplary embodiments are shown in FIGS. 4 and 5.

Also, the sum/difference amplifier 411, integrator 413, 415 and control circuit shown in FIG. 3 may be represented with a variety of embodiments. Three different but equivalent representations of the unity gain sum/difference amplifier are shown in FIGS. 6, 7, and 8. FIG. 6 is a symbolic representation of the sum-difference function having two positive input terminals and a negative input terminal. The output voltage $v_d$ is related to the inputs as follows, $v_d = v_a - v_b + v_c$. This representation is numbered 411 in FIG. 3.

FIG. 7 is a realization of this function using operational transconductance amplifiers 412, 414, where the control currents $I_{xa}$ and $I_{xb}$ set the transconductance values $g_{ma}$, and $g_{mb}$. If $I_{xa} = I_{xb}$, $g_{ma} = g_{mb} = g_m$.

If the loading on the output of amplifier 414 is negligible (i.e. output current i.e., is very small) $i_{oa} = -i_{ob}$ and $g_m(v_a - v_b) = -g_m(v_c - v_d)$ which gives $v_d = v_a - v_b + v_c$.

FIG. 8 is a transistor realization of FIG. 7 in which two OTA's as shown in FIG. 22 have been combined in a simplified form. In FIG. 8, the difference between the collector currents of transistors 472, 474, $(i_a - i_b)$ and transistors 480, 478 $(i_c - i_d)$ corresponds to the currents $i_{oa}$ and $I_{ob}$ respectively of FIG. 7. These differences could be performed by the standard PNP current mirror loading of a differential NPN pair as configured in FIG. 22. However, in FIG. 7, $i_{oa}$, and $i_{ob}$ are summed. Therefore, $i_{oa} + i_{ob} = (i_a - i_b) + (i_c - i_d)$ which can be rearranged give:

$i_{oa} + i_{ob} = (i_a + i_c) - (i_b + i_d)$ which shows that the collector currents of transistors 474 and 478 may be summed first (by paralleling) and combined with the output current of a single PNP current mirror whose input is the sum of the collector currents (by paralleling) of transistors 472 and 480. Thus, only one PNP mirror (dual collector transistor 496) is required.

Similarly, three different but equivalent representations of a variable integrator are shown in FIGS. 9, 10, and 11. For the symbolic representation of a differential, variable integrator shown in FIG. 9, for example, the output is given by the following equations.

In the time domain:

$$v_c = K\, I_x \int (v_a + v_b)\, dt$$

where $I_x$ is a control current and K is a proportionality constant.

In the frequency domain:

$$v_c = (K\, I_x/jw)(v_a - v_b)$$

The integrator shown in FIG. 10 is an OTA with a capacitor load. The output current for the OTA is given by the equation below:

$$i_o = g_m (v_a - v_b); \text{ where } g_m = hI_x$$

The voltage across a capacitor is equal to the integral, over time, of the current through the capacitor. Or, in the frequency domain: $v_c = i_o/jWC$. Thus, loading the OTA with a capacitor with no additional loading gives:

$$v_c = \frac{g_m}{jWC}(v_a - v_b) = \frac{hI_x}{jWC}(v_a - v_b)$$

or the representation of an integrator shown in FIG. 11, the OTA has been realized with the transistor equivalent shown in FIG. 22. The equation is shown below:

$$g_m = \frac{I_x}{2V_T}$$

With no external loading, all of the current $i_o$ flows into the capacitor and:

$$v_c = \left(\frac{I_x}{2V_T}\right)(1/jWC)(v_a - v_b)$$

Finally, first and second embodiments 501, 503 of a control circuit are shown in FIGS. 12 and 12a. The embodiment of the control circuit 501 shown in FIG. 12 receives a frequency control current, designated $I_w$, and respectively provides related control currents $I_{x1}$ and $I_{x2}$. The control circuit 501 includes a transistor 505 having an interconnected base and collector. The transistor 505 develops a base to emitter voltage, which is related to the frequency control current applied to the base and collector of the transistor 505.

The control circuit 501 also includes first and second control transistors 507 and 509. Each of the transistors 507, 509 receives the base to emitter voltage developed by transistor 505 and provides a collector current designated, respectively, $I_{x1}$ and $I_{x2}$.

As show in FIG. 12, the transistors 507 – 509 are each single devices. In the preferred embodiment, the collector currents of the first and second control transistors 507 and 509 are, respectively, $n_1$ and $n_2$ times the collector current of the transistor 505, which is substantially equal to the control current $I_w$. This may be accomplished using only substantially identical transistors as would be available on a semi-custom integrated circuit, by having $n_1$ . devices connected in parallel in place of the first control transistor 507 and $n_2$ devices connected in parallel in place of the second control transistor 509. Alternatively, the emitter area of the transistor 505 and first and second control transistors 507, 509 can bear a relationship to each other, respectively, of 1 to $n_1$ to $n_2$.

Consequently, if the transistors 505, 507, 509 each have high current amplification characteristics ("betas"), then $I_{x1} = n_1 I_w$ and $I_{x2} = n_2 I_w$. The currents $I_{x1}$ and $I_{x2}$ then control the operation of the filter such that the filter corner frequency is linearly related to the frequency control current, $I_w$ and the quality factor remains constant as the frequency control current is varied.

The embodiment of the control circuit 503 shown in FIG. 12a receives a frequency control voltage, designated $V_w$, and respectively provides related control currents $I_{x1}$ and $I_{x2}$. The control circuit 503 includes first and second transistors 511, 513. Each transistor 511, 513 includes a base to receive the frequency control voltage. The transistors 511, 513 then respectively provide collector currents $I_{x1}$ and $I_{x2}$.

Again the collector currents of the two transistors 511, 513 may be multiples of some reference current. Such multiples, designated in FIG. 12a as $n_1$ and $n_2$ may, of course, be achieved by using similar transistors in parallel or by controlling the emitter-base junction areas of the transistor 511, 513.

The collector currents, $I_{x1}$ and $I_{x2}$, as before, control the filter. These currents are substantially described by the following equations:

$$I_{x1} = n_1 I_s \exp(V_w/V_T)$$

$$I_{x2} = n_2 I_s \exp(V_w/V_T)$$

where $V_T$ again is the transistor thermal voltage, as previously defined, and $I_s$ is a constant which is IC process dependent and temperature dependent. Notably, however, transistors formed on a single integrated circuit typically match well. The ratio of $I_{x2}$ to $I_{x1}$ is thus $n_2/n_1$.

To control $I_x$ adequately, $V_w$ should be derived from a regulator on the same chip. See, for example, the regulator with variable reference outputs shown in FIG. 24.

The currents $I_{x1}$ and $I_{x2}$ then control the operation of the filter such that the filter corner frequency is exponentially related to the frequency control voltage, $V_w$, and the quality factor remains constant as the frequency control voltage is varied.

For a two Pole Butterworth Filter, $Q = 1/\sqrt{2}$

For $C_1 = C_2 = C,\ Q = \sqrt{I_{x2}/I_{x1}}$

When $I_{x1} = 2I_{x2}$ then, by definition, $Q = \frac{1}{2}$ and the filter gives the classic Butterworth response.

Under this condition:

$$W_o = (h/C)\, I_{x2} \sqrt{2}$$

As shown in more detail in FIGS. 13 and 14, the present invention includes a two pole filter 410. The filter 410, the basic building block for higher order filters, is shown in more detailed form in FIG. 13. In this figure, the representation of the unity gain sum-difference amplifier shown in FIG. 7 is substituted for the more general representation of the unity gain sum-difference amplifier 411 shown in Fig. 3.

The filter 410 is shown in a yet more detailed form in FIG. 14. In this figure, the representation of the unity gain sum-difference amplifier 411 shown in FIG. 8 and the representation of the capacitor loaded operational transconductance amplifiers 413, 415 shown in FIG. 11 are substituted for their more general representations shown in FIG. 3.

Notably, one side of each capacitor is interconnected to the ac ground line. One end of all of the capacitors share a common node. As a result, the number of pad connections is reduced.

The two-pole filter 410 may, of course, be interconnected in tandem, as shown in FIGS. 15 and 16, to achieve, respectively, a four pole highpass or a four pole lowpass filter. Filter control circuits which may be used with such filters are shown, for example, in FIGS. 17 and 18, which are the same as the two pole control circuits of FIGS. 12 and 12a, with the addition of transistors identified by xn3 and xn4 to supply control currents $I_{x3}$ and $I_{x4}$ to the second two pole filter section. Thus, for the four pole lowpass filter of FIG. 16, the lowpass terminal 434 is interconnected to an input line of another filter which is structurally similar to the filter shown in FIG. 3. The lowpass output terminal of this second two pole filter then provides a four pole lowpass filter response.

Similarly, the highpass output terminal 436 of the filter 410 may be interconnected to the input terminal of the second filter. (The second filter of course, is structurally similar to the filter shown in FIG. 3) The highpass output terminal of the second filter then provides four pole highpass response. Two filters such as that shown in FIG. 3 may, of course, also be similarly interconnected to provide a four pole bandpass response.

For 4-Pole Butterworth Filter made up of two Cascaded 2-Pole Filters:

| | |
|---|---|
| $w_1 = w_o$ | $Q_1 = .5411$ |
| $W_2 = W_o$ | $Q_2 = 1.306$ |

The order of cascading does not affect frequency response. If we make $C_1=C_2=C_3=C_4=C$, then the current values may be set such that $I_{x2}/I_{x1} = Q_1^2 = .2928$
and
$I_{x4}/I_{x3} = Q_2^2 = 1.706$
and $w_1 = w_2 = (h/C)\sqrt{I_{x1} I_{x2}} = (h/C)\sqrt{I_{x3} I_{x4}}$ $I_{x1} (.5411) = I_{x3} (1.306)$
$I_{x1}/I_{x3} = 2.414$ which does not permit exact integer ratios between the currents $I_{x1}$, $I_{x2}$, $I_{x3}$, and $I_{x4}$. These ratios could be obtained in a custom integrated circuit design, where the emitter-base junction areas of transistors $X_{n1}$ through $X_{n4}$ can be made in non-integer ratios. To approximate a 4-Pole Butterworth Filter with integer ratios:

make $I_{x1} = 3I_{x2}$ $Q_1 = \sqrt{1/3} = .577$ $2I_{x3} = I_{x4}$ $Q_2 = \sqrt{2/1} = 1.414$ $I_{x2} = I_{x3}$ $w_1/w_2 = \dfrac{(h/C) I_{x2} \sqrt{3}}{(h/C) I_{x3} \sqrt{2}} = 1.225$ In many cases, this is an acceptable approximation to a Butterworth response.

It may be obtained with integer multiples of selected currents, which can be achieved on standard integrated circuits by using integer numbers of transistors connected in parallel. For a closer approximation, let $I_w$ be the control current supplied by a single control circuit transistor. Then $I_{x1} = (7)(I_w),$   $I_{x2} = (2)(I_w),$ $Q_1 = \sqrt{2/7} = .5345$ $I_{x3} = (3)(I_w),$   $I_{x4} = (5)(I_w),$ $Q_2 = \sqrt{5/3} = 1.291$ $w_1/w_2 = \dfrac{(h/C) I_w \sqrt{14}}{(h/C) I_w \sqrt{15}} = .9661$ The output of the low and high pass filter 54, 56 is received by the variable slope filter 62. The filters 54, 56 and 62 modify the frequency response of the circuit 20, and thus are generally referred to as tone controls.

Variable Slope Filter 62

The hearing aid circuit 20 further includes a low element count, continuously variable slope response shaper, generally described as a variable slope filter 62. The response of the variable slope filter 62 to an input signal may be continuously varied from a highpass through a flat response to a lowpass filter. As shown in FIG. 25, the filter 62 includes an input terminal 178, ground line 180, first, second, and third transconductor amplifiers, 182, 184, 186, lowpass, varable slope, and highpass output terminals 188, 190, 192, a potentiomer 194, and a capacitor 196. The potentiomer 194 is the variable slope control 64 shown in FIG. 2.

The filter 62 receives an input signal at the input terminal 178. The first transconductor amplifier 182 includes first or positive and second or negative inputs 198, 200 and an output 202. The positive input of amplifier 182 is interconnected to the input terminal 178 and receives the input signal. In response, amplifier 182 provides a first transconductor signal at its output 202.

The capacitor 196 is interconnected between the first transconductor amplifier output 182 and the ground line 180. The second or negative input 200 to the first transconductor amplifier 182 is interconnected to its output 202. High frequency input signals are effectively shunted through the capacitor 196 to ground. Thus, the amplifier 182 and capacitor 196 form a single pole lowpass filter.

The second transconductor amplifier 184 also includes first (or positive) and second (or negative) inputs 204, 206 and an output 208. The first input is also interconnected to the input terminal 178. The second input 206 is interconnected to the output 202 of the first transconductor amplifier 202. The output 208 of the second transconductor amplifier is connected to the highpass terminal 192.

The third transconductor amplifier 186 includes first (or positive) and second (or negative) inputs 210, 212 and an output 214 as well. The first input 210 is interconnected to a reference voltage. The output 214 and second input 212 are interconnected to the output 208 of the second transconductor amplifier 184 and highpass terminal 192.

The third amplifier 186 presents a load impedance of approximately $1/g_{m3}$ to the second amplifier 184, such that the voltage gain of amplifier 184 is $A_{v2} = g_{m2}/g_{m3}$. If $g_{m2}$ and $g_{m3}$ are set equal, $A_{v2} = 1$. This method of active loading produces better linearity for high signal amplitudes by presenting the amplifier with a load whose nonlinearity is essentially complimentary to the nonlinearity of the amplifier being loaded.

The potentiometer 194 includes a wiper 216. The end terminals of the potentiometer 194 are respectively interconnected to the highpass and lowpass terminals 188, 192, and the variable slope terminal 190 is interconnected to the wiper 216 of potentiometer 194. By moving the wiper 216 from one end of the potentiometer 194 to the other, the output of the filter 62 gradually changes from that of a lowpass to a highpass filter. When in the middle, the terminal 190 provides a reasonably flat response output. The ratio of the voltages of the lowpass terminal 188 and input terminal 178 is given by the formula given below:

$$\frac{v_{out}}{v_{in}} = \frac{1}{1 + \frac{(jW)C}{g_{m1}}}$$

again where $j = -1$ and $w = 2$ times the frequency of the signal, C is the value of the capacitor 196, and $g_{m1}$ is the transconductance of the first transconductor amplifier 182.

The lowpass filter has a corner frequency, $f_c$, equal to the following:

$$f_c = \frac{g_{m1}}{2\pi C}$$

where $g_{m1}$ is the gain of the first transconductor (or amplifier) 182 and C is the value of the capacitor 196 If the gain of the second and third transconductor amplifiers 184, 186 is approximately equal, the highpass terminal voltage approximately equals the input terminal voltage minus the lowpass terminal voltage.

The ratio of the highpass terminal voltage divided by the input voltage is given by the formula below:

$$\frac{v_{out}}{v_{in}} = \frac{\frac{(jW)C}{g_{m1}}}{1 + \frac{(jW)C}{g_{m1}}}$$

The corner of this filter is then also at the frequency $$f_c = \frac{g_{m2}}{2\pi C}$$

The potentiometer 194 has a relatively large value compared to the output impedances seen at the lowpass and highpass output terminals, 188, 192, in order to reduce loading of the resistor on the circuit. Such loading, of course, causes deviations from idealized highpass and lowpass filter responses. The output at the wiper 216 is a variable weighted sum of the highpass and lowpass terminal voltages.

In the preferred embodiment, the filter 176 uses only two discrete components: the capacitor 196 and the potentiometer 194. Thus, the present embodiment of applicant's invention reduces the elements required and size of the circuit.

In addition, the filter 62 provides for both highpass and lowpass outputs simultaneously. Moreover, varying the potentiometer 194 gives close to an apparent constant volume because there is some attenuation at all frequencies at the midpoint "flat" setting. Rotating the control away from the midpoint simultaneously reduces the output at one end of the frequency spectrum while raising the output at the opposite end of the frequency spectrum.

Differential Voltage Threshold Detector (e.g.,
"Compand" detector 48; AGC detector 702; AGC Detector 86

The "compand" detector 48 must determine that the voltage emitted by the input current controlled amplifier 48 has increased sufficiently such that the "compand" circuitry should be activated. The "compand" detector 48 must accurately sense very small voltages, in the range of tens of millivolts, for proper operation. A sensitive voltage threshold detection circuit is thus required.

Prior art voltage threshold detection schemes frequently used a system in which a circuit compared a measured voltage to a standard reference voltage. A diode voltage drop of, for example, 0.6 or 0.7 volt, was often used as the reference voltage. In order to achieve sensitivity in the order of tens of millivolts, however, such prior art systems often required preamplification of the measured signal prior to sensing. This preamplification adds to the complexity and size of the system.

Moreover, differential full wave rectification of the signal to be sensed prior to threshold detection adds significantly to the complexity of the system. Thus, as shown in FIG. 19, the present invention 20 uses a differential voltage threshold detector 92 for sensing the difference between first and second terminals 94, 96, and providing an output signal at an output terminal 97 when the voltage differential exceeds a predetermined level As shown in FIGS. 19 and 20, the detector 92 includes a differential transconductance stage 90, two first and second "top" current mirrors 102, 104, first and second "bottom" current mirrors 106, 108, a detector 110, and a reference current source 115. The differential transconductance stage, having differential outputs, can be in the form of a differential pair of NPN transistors 111, 113, each having a base 112, 114, collector 116, 118, and an emitter 120, 122. The emitters 120, 122 are connected to the single reference current source 115 (which can be a transistor 117, as shown in FIG. 20). The bases 112, 114 are inter connected to the two input terminals 94, 96 between which the voltage differential should be sensed The transistor 111 draws a first current (designated $I_a$) through its collector 116 and emitter 120. The transistor 113 draws a second current (designated $I_b$) through its collector 118 and emitter 122.

The two transistors 111, 113 are interconnected as a differential pair. Thus, the voltage difference between the input terminals 94, 96, and thus the two bases 112, 114 of the transistors 111, 113, determines the ratio of the currents $I_a$ and $I_b$.

The first top mirror 102 is interconnected to the first transistor collector 116. The first primary mirror 102 senses the current $I_a$ and responsively issues two other currents, which are multiples of current $I_a$. In FIG. 19, these currents are designated, respectively, as $XI_a$ and $YI_a$.

The second top current mirror 104 is interconnected the second transistor collector 118 in a similar manner. The second primary mirror 104 senses the current $I_b$ and responsively issues currents which are multiples of the current $I_b$. Such currents are respectively designated as $XI_b$ and $YI_b$.

The threshold detector 92 also includes first and second bottom current mirrors 106, 108. The first bottom current mirror 106 is interconnected to the top current mirrors 102, 104, as shown in FIG. 19, so as to receive the current YIb Similarly, the second bottom current mirror 108 is interconnected to the first and second top current mirrors 102, 104, as shown in FIG. 19, so as to receive the current $YI_a$.

In response to receiving the current $YI_b$, the first bottom current mirror 106 draws a multiple of the current $YI_b$ designated as $ZYI_b$ in FIG. 2. The leads carrying the currents $XI_a$ and $ZYI_b$ are joined at a first node 124.

Similarly, the lead carrying current $YI_a$ is received by the second bottom current mirror 108, whereby the second bottom current mirror 108 draws a multiple of the current $YI_a$ designated as $ZYI_a$ in FIG. 2. The leads carrying the currents $XI_b$ and $ZYI_a$ are joined at a second node 126. The first and second nodes 124, 126 are interconnected to the detector 110. The detector 110 functions similarly to a logical NOR gate, although, of course, the type of output or output impedance may be different than that of a logical NOR gate.

Consequently, when the current $XI_a$ is greater than or equal to the current $ZYI_b$, the voltage swings high at the node 124 and at the input of the detector 110. Similarly, the voltage swings high at the node 126 and at the other input to the detector 110 when $XI_b$ is greater than or equal to the current $ZYI_a$.

Thus, when the difference between the voltages applied to the bases 112, 114 of the differential transistors 111, 113 exceeds a significant amount, the voltage swings high at one of the nodes 124, 126 and the threshold detector 92 is thereby enabled to sink a current at its output terminal 97. Such a signal signifies that the differential in voltage between the two input terminals exceeds a predetermined level.

A more detailed schematic, showing the transistor by transistor makeup of the detector 92 is shown in FIG. 20. In FIG. 20, the current mirrors 102, 104, 106, 108 are shown configured with transistors, and the current mirror ratios x, y and z are set at 1, 2 and 1 respectively. The top mirrors 102, 104 are constructed With dual collector PNP devices (commonly available on semicustom ICs) whose collectors draw substantially equal currents, providing the function of 2 PNP devices with paralleled bases and emitters in the space required for one PNP device. For the above mirror ratios, detection occurs when $I_a$ $2I_b$ or when $I_b$ $2I_a$.

The ratio of the currents $I_a$ and $I_b$ in the threshold detector 92 may be approximated by the following formula:

$$\frac{I_a}{I_b} = \exp\left(\frac{\Delta V_{be}}{V_T}\right)$$

or $$V_{be} = (V_T)\ln\left(\frac{I_a}{I_b}\right)$$

where $V_{be}$ is the difference in voltage between the bases 112, 114 of the transistors 111, 113. For detection, $\Delta V_{be} \geq V_T l_n (2)$ or $V_{be} \leq V_T l_n (\frac{1}{2})$. Therefore, at room temperature, detection occurs when differences in the base to emitter voltages exceeds approximately $\pm$ 18 millivolts Thus, the detector 110 in the threshold detector 92 provides an output signal when the difference in voltages applied to the two terminals 94, 96 exceeds approximately $\pm$ 18 millivolts The present threshold detector 92 thus functions by comparing the ratioed collector currents of a differential pair. This arrangement includes an inherent differential/full wave operation, without the need for additional circuitry. Moreover, a voltage supply substantially as low as one volt may be used to power the present detector 92.

Compansion System (including, e.g. Compander 24 and a portion of the Main Amplifier 32)

See FIGS. 21 and 22. The compander 51 includes both a compression circuit 128 to limit the input signal amplitude to the filter 26, and an expansion circuit after the filter. The expansion circuit restores a linear input-output amplitude relationship and prevents overloading and subsequent distortion in the filter 26, thereby increasing the dynamic range of the filter.

As shown in FIG. 21, the compression circuit 128 includes an operation transconductance amplifier ("OTA") 132, threshold detector 134, load resistor 136, feedback bypass capacitor 138, detector filter capacitor 140, input lead 141, gain control terminal 152, and ground line 142. A more detailed schematic showing the transistor by transistor makeup of a typical OTA as used in the present invention, is shown in FIG. 22.

The "expansion" circuit includes a second OTA amplifier 144, load resistor 146, inverting amplifier 148, feedback bypass capacitor 150, and gain control terminal 154. In the preferred embodiment used in the hearing aid circuit, the first and second amplifiers 132, 144 are included in, respectively, the input current controlled amplifier 46 and main amplifier 32. The voltage threshold detector is comprised of the differential voltage detector 92 described above.

To clarify the description of the present invention, the input current controlled amplifier 46 and main amplifier 32 correspond to the first and second amplifiers 132, 144 in FIG. 21. Similarly, the capacitors 138 and 150 are actually a part of, respectively, input CCA 46 and main CCA 66 shown in FIG. 2. Also, the compand filter 50 is comprised of the detector filter capacitor 140. In addition, the two load resistances 136, 146 are shown figuratively in FIG. 21 as discreet load resistances, whereas the amplifiers 46 and 32 as shown in FIG. 2 include these resistances. Moreover, the transistors 145 and 147 correspond to voltage controlled exponential current sources. Thus, the transistor 145 performs the functions of the input CCA control 52 and the transistor 147, together with the inverting amplifier 148, performs a portion of the function of the main CCA control 68. Exponential current sources are further described in a following section. See, e.g., FIG. 23.

An input signal is applied to the input lead 141. The signal is then amplified by the first amplifier 132 and transmitted to the voltage controlled filter 131. The threshold detector 134 senses if the signal provided by the first amplifier 132 is so large that it exceeds the proper dynamic range of the voltage controlled filter 131. If so, the threshold detector 134 issues a gain control signal to both the gain control terminal 152 of the first amplifier 132 and the expansion circuit 130.

The signal received via the gain control terminal 152 reduces gain of the first amplifier 132. Thus, for example, upon sensing that the output of the first amplifier 132 exceeds a predetermined amplitude, such as 18 millivolts, the threshold detector 134 emits a signal to the base 149 of transistor 145. The transistor 145, in turn, supplies $I_{x1}$ (which is exponentially related to the control voltage applied to base 149) to the gain lead 152 of the first amplifier 132. Consequently, the output of the first amplifier 132 is reduced to a level not substantially exceeding the predetermined amplitude.

In the preferred embodiment, the first amplifier 132 is a variable transconductor amplifier (see FIG. 22) which provides a gain proportional to a gain control current ($I_{x1}$) The gain of the first amplifier is referred to as $g_{m1}$ When the detector 134 is not triggered, $g_{m1}$ is determined by a gain reference voltage ($V_{ref}$) 143 applied to base 149 via resistor 141, such that $V_c$ substantially equals $V_{ref}$ The output of the first amplifier 132 is received and modified by the tone controller filter 26 and then transmitted to the expansion circuit 130. In the preferred embodiment, the second amplifier 144, like the first amplifier 132, is a transconductance amplifier with a gain control lead 154 whose gain ($g_{m2}$) is controlled by $I_{x2}$ which is supplied by transistor 147.

The inverting amplifier 148 receives the same signal applied to the base 149 and inverts the difference between this voltage ($V_c$) and $V_{ref}$ and responsively applies a signal $V_{EX}$ to the base lead 151 of the transistor 147 such that $V_{EX} = V_{ref} + (V_{ref} - V_c)$. The second amplifier 144 then receives the inverse of the gain control signal provided to the first amplifier 132. Consequently, the gain control "function" applied to the signal by the second amplifier 144 ("$g_{m2}$") will be the inverse of the function applied by the first amplifier. Thus, the gain $g_{m1}$ multiplied by the gain $g_{m2}$ substantially equals a constant. This product of the gains is kept constant by the inverting amplifier 148.

The output of the second amplifier 144 is applied between an output terminal 146 and the ground line 142. The capacitors 138, 150, respectively, provide AC bypassing of the feedback taken from load resistors 136, 146, allowing full DC feedback with substantially open loop AC performance for the amplifiers 132 and 144.

The detector filter capacitor 140 of the compression circuit 128 smooths out the sharp spikes in the output of the threshold detector 134 so that the control voltage ($V_c$) and thus the gain changes smoothly to prevent the excessive distortion of the signal being amplified. This capacitor also defines the attack time constant and, in conjunction with the resistor 141, defines the release time constant of gain change.

The use of a single threshold detector 48 and detector filter capacitor 140 provides very good input/output transient characteristics during release periods, since the gains of the input and output amplifiers 132, 144 change substantially simultaneously. The system 51 further provides good transient performance during the attack periods.

Differential Voltage Controlled Exponential Current Source (within, e.g., Input Current Controlled Amplifier Control 52, Main CCA Control 68, and Clipper 74)

An exponential current source 148 shown in FIG. 23 provides means for differentially combining voltages and producing an exponentially related current output. This current is also linearly related to an input current. The current source 148 may be used as a building block to produce complex control functions.

For example, the main current controlled amplifier control 68 combines various control functions to provide a single gain control current to main current controlled amplifier 66 which is exponentially related to a combination of control voltages The current source 148 includes a first transistor 161, output transistor 163, and a feedback transistor 156.

The first transistor 161, in the form of a NPN transistor with a collector 158, base 160, and emitter 162, receives the input current, Iin, as shown in FIG. 23, which is then directed to the feedback transistor 156. By receiving the input current, the first transistor 161 has a base to emitter voltage given by:

$$V_{be1} = V_T \ln\left(\frac{I_{in}}{I_s}\right)$$

where $I_s$ is the saturation current of the transistor.

The output transistor 163 is also in the form of an NPN transistor having a collector 164, base 166, and emitter 168. The emitters 162, 168 of the first and output transistors 161, 163 are interconnected. Accordingly, the first and output transistors 161, 163 form a differential pair.

The feedback transistor 156 is an NPN transistor having a collector 172, base 174, and emitter 176. The base of the feedback transistor is interconnected to the collector 158 of the first transistor 161. The collector 172 of the feedback transistor 156 is interconnected to the emitters 162, 168 of the first and output transistors 161, 162 as shown. A control voltage ($V_{in}$) is applied between the two bases 160, 166 of the first and output transistors 161, 162.

Input current ($I_{in}$) flowing through the collector 158 of the first transistor 161 (minus the small base current of the feedback transistor 156) necessarily flows into the collector 172 of the feedback transistor 156. The feedback transistor 156 regulates the base to emitter voltage of the first transistor 161 such that the collector current of the first transistor substantially equals the input current. Linear changes in the difference in the voltage between the first and second bases 160, 166 necessarily implies that the current through the collector 164 ($I_{out}$) and emitter 168 of the output transistor 163 must change exponentially. The feedback transistor collector 172 also absorbs the current from the emitter 168 of the output transistor 163.

X is the ratio of the area of the emitter 168 of the output transistor 163 divided by the area of the emitter 162 of the first transistor 161.

In the preferred embodiment, the current source 148 is formed on a single integrated circuit. The first and output transistors 161, 163 may accordingly have emitter areas of predetermined ratios. Thus, the output current is given by the following formula:

$$I_{out} = I_{in} \left[ \exp\left( \frac{V_{be2} - V_{be1}}{V_T} \right) \right] X$$

where $V_{be2}$ is the voltage between the base 166 and emitter 168 of the output transistor 163, $V_{be1}$ is the voltage between the base 160 and emitter 162 of the first transistor 161, and X is the ratio of the area of the emitter 168 of the output transistor 163 divided by the area of the emitter 162 of the first transistor 161.

The current source 158 provides an exponential change in output current for a linear change in voltage between the base 160 of the first transistor 161 and the base 166 of the output transistor 163. The current source 148 may be used to provide the input current for additional current sources like the current source 148, thus allowing the combination of more than two voltages to exponentially control an output current. Such an arrangement may thus be used to control the gain of the main current controlled amplifier 66. The current source 148 may also be applied in many other hearing aid applications, since a "perceived" linear increase in "loudness" requires a substantially exponential increase in amplitude of the sound. Thus, with the present invention, by turning a linear potentiometer, the user of a hearing aid may achieve an apparent linear change in volume (and an exponential change in amplitude).

In addition, the present embodiment of applicant's invention includes only a limited number of components, thus making the circuit more compact. Moreover, the current source 148 may operate with a very low supply voltage, such as one volt.

Regulator with Variable Reference Voltage Outputs (within, e.g.,the Highpass and Lowpass Corner Controls 58, 60)

A regulator 218 provides a pair of constant reference voltages at first and second output terminals 282, 284. See FIG. 24. The reference 218 also includes a variable $V_{bout}$ voltage reference output terminal 280 which may be used to supply a base to emitter voltage over a predetermined range between the above-mentioned pair of reference voltages to a string of transistors used as current sources. Such a regulator 218 may be used, for example, to accurately control the currents $I_{X1}$, $I_{X2}$, $I_{X3}$, $I_{X4}$ supplied by the highpass and lowpass corner control circuit shown in FIG. 18 to the highpass and lowpass filters 54, 56.

In particular, on integrated circuits it is often important to bias one or series of bases of transistors such that the collector current of each transistor is of a desired magnitude. In order to achieve this, a reference transistor is provided which draws a predetermined current. The same base to emitter voltage necessary to drive this reference transistor may then be used to supply the proper base to emitter voltage, so that a similar current will be drawn by other similar transistors.

As shown in FIG. 24, the regulator 218 includes first and second top transistors 220, 222, first and second non-inverting amplifiers 224, 226, first and second bottom transistors 228, 230, a potentiometer having an end-to-end resistance of ($R_{set}$) 232, and a current reference transistor 234. The first and second top transistors 220, 222 in the form of PNP transistors, are interconnected as shown in FIG. 24.

The transistors 220, 222 include collectors 236, 238, interconnected bases, 240, 242, and interconnected emitters 244, 246. The first amplifier 224 includes positive and negative inputs 248, 250 and an output 252. The output 252 is interconnected to the bases 240, 242 of the two transistors 220, 222 to drive them in a similar manner.

The first and second top transistors 220, 222, in the most preferred embodiment, are formed on a single chip. Thus, they have geometries which are closely controlled, and the area of the emitter 246 of the second top transistor 222 is "X" times larger than the area of the emitter 244 of the first top transistor 220. In the most preferred embodiment used by applicant, X equals 3.

The current traveling through the collector 236 of the first top transistor 220 is designated Ip As shown in FIG. 24, the current going through the collector 238 of the second top transistor 222 is equal to (X)(IP)

The first and second bottom transistors 228, 230 each include a collector 260, 262, base 264, 266, and interconnected emitters 268, 270. The area of the emitter 270 of the second bottom transistor 230 is "Y" times larger than the area of the emitter 268 of the first bottom transistor 228. In the most preferred embodiment used by applicant, Y equals 2. The collectors 260, 262 of the first and second bottom transistors 228 230 are respectively interconnected to the collectors 238, 236 of the second and first top transistors.

The voltage at the collector 236 of the first top transistor 220 is interconnected to the positive input 248 of the first amplifier 224, and a reference voltage biases the negative input 250 of the first amplifier 224. Thus, the first amplifier 224 completes a feedback loop between collector 236 and base 240 of transistor 220 to insure that the current through the collector 236 of the first top transistor 220 (designated $I_p$) substantially equals the current through the second bottom transistor 230 (designated $I_{n2}$).

The second amplifier 226 includes positive and negative inputs 254, 256 and an output 258 which drives the first output terminal 282. The collector 260 of the first bottom transistor 228 is interconnected to the positive input 254, and a reference voltage biases the negative input to the second amplifier 226. The output 258 is then interconnected to drive the bases 264, 274 of the first bottom transistor 228 and the reference transistor 234 which will both have a base to emitter voltage of $V_{BE}$. Thus, the second amplifier completes a feedback loop between the collector 260 and base 264 of transistor 228 to insure that the collector current ($I_{n1}$) of transistor 228 substantially equals the collector current ($XI_p$) of the second top transistor 222. Therefore $I_{n1}/I_{n2} = XI_p/I_p = X$ The current reference transistor 234 includes collector 272, base 274, and emitter 276, interconnected as shown. The ratio of the area of emitter 276 to the area of the emitter 268 of the first bottom transistor 228 is Z (in the preferred embodiment shown, Z = 2). Therefore, the collector current of reference transistor 234 is substantially equal to $ZI_{n1} = 2I_{n1}$. Z, of course, can be chosen to accommodate a variety of end-to-end resistances for the potentiometer 232.

A potentiometer 232, with ends interconnected between the first and second output terminals 282, 284, has a wiper arm 278 interconnected to terminal 280 ($V_{Bout}$).

The voltage ($V_{be2}$) between the collector 272 and emitter 276 of the current source transistor 234 is provided to drive the base 266 of the second bottom transistor 230, and is also available at the second output terminal 284.

$I_{n1}/I_{n2} = X$ can be satisfied only when:
$V_{be1} - V_{be2} = V_T \ln(XY)$ where $V_{be1}$ and $V_{be2}$ are, respectively, the base to emitter voltages of the first and second bottom transistors 228, 230. Since the ends of potentiometer 232 are interconnected between the base 264 and the base 270, $V_{be1} - V_{be2} = R_{set}(Z\, I_{n1})$.

Therefore, $R_{set}(I_{n1}) = \dfrac{V_T \ln(XY)}{Z}$

Accordingly, the voltage ($V_{bout}$) at the output terminal 280 on the wiper of the potentiometer 232 may be adjusted over a range of values. The top, highest value is equal to the output voltage at the first output terminal 282, and is also equal to $V_{be1}$ which is sufficient to drive the first bottom transistor 228 to have the current $I_{n1}$ through it. This same output voltage is therefore also sufficient to make other similar (referred to as a "slave") transistors (i.e., having the same emitter area) elsewhere in the hearing aid circuit 20 draw this current.

When the wiper of the potentiometer 232 is moved downward to its lowest setting, toward the current reference transitor 234 voltage on the wiper is equal to the voltage ($V_{be2}$) at the second output terminal 284 which is supplied to the base 266 of the second bottom transistor 230, which is sufficient to cause the above slave transitor to draw a current of $\dfrac{I_{n1}}{(X)(Y)}$ In the preferred embodiment X = 3 and Y = 2, so that varying the wiper of the potentiometer 232 allows a base to emitter voltage sufficient to drive a slave transistor such that it will have a current between $I_{n1}$ and $I_{n1}/6$.

Control over the voltage of the output lead ($V_{Bout}$) 280 thus allows substantially tight control over the current drawn by any other similar transistor whose base is interconnected to the output lead 280 and whose emitter is interconnected to the ground line 286. The current regulator 218 allows the reference current ($I_{n1}$) to be set with only the end-to-end resistance of potentiometer 232, minimizing the number of bulky and space-consuming resistors that must be used.

Moreover, there is a precisely defined range of adjustment, which is defined simply by the transistor geometries. Of course, additional transistors could have their base emitter junctions placed in parallel with that of the slave transistor in order to drive additional current sources. The slaved transistors may also have independently predetermined emitter area ratios to provide a variety of different currents all adjustable over a range spanning a ratio equal to X times Y. Additional potentiometers may be placed in parallel with potentiometer 232 (their parallel value equalling $R_{set}$) to provide simultaneous, independently adjustable outputs over the same voltage range as before.

The placement of the first amplifier 224 driving the first and second top transistors 220, 222 makes the current reference 218 substantially insensitive to the current gain characteristics ("betas") of the first and second top transistors 220, 222. This is advantageous in light of the typically low, loose-tolerance beta of PNP transistors in the usual integrated circuit.

Additionally, since the current $I_p$ is also regulated, "slaved" PNP transistors may be biased from the voltage developed from base 240 to emitter 244 of the first top transistor 220 to supply currents related to $I_p$ by the emitter area ratio between transistor 220 and the slaved PNP transistors.

Detailed embodiments of the first and second amplifiers 224, 226 are shown in FIGS. 24a and 24b, respectively. It should be noted that differential input amplifiers, as shown in FIG. 24, are not essential to proper operation (in this case Vref can be thought of as "ground") and that the detailed amplifiers shown allow operation with very low supply voltages (substantially as low as 1 volt).

Current Controlled Clipper 74

As shown in FIGS. 2 and 26, the clipper 74 receives an input signal and provides an output signal of a substantially predetermined maximum amplitude. Accordingly, the aid is substantially prevented from producing an uncomfortably loud signal for the hearing aid wearer.

In the preferred embodiment, the clipper 74 includes first and second differential operational transconductance amplifiers 282, 284, an input terminal 288, voltage reference line 290 (approximately 0.8 volt for the embodiment shown), output terminal 292, load resistance 293, auxiliary output terminal 295, and adjustable current source 297.

The first and second transconductance amplifiers 282, 284, each include a first positive input 294, 296, a second negative input 300, 302, and an output 306, 308. The positive input 294 of the first transconductance amplifier 282 is interconnected to the input terminal 288, and receives an input signal from the main current controlled amplifier 66. The negative input 300 is interconnected to the output terminal 292 and the output 308 of the second transconductance amplifier 284. The output 306 of the first transconductance amplifier 282 is interconnected to the positive input 296 of the second transconductance amplifier 284. The negative input 302 is interconnected to the reference line 290.

The second transconductance amplifier 284 is a standard operational transconductance amplifier, as shown in FIG. 22, with the adjustable current source 297 interconnected to control the transconductance ($gm_2$). The magnitude of the current supplied by the current source 297 sets the peak value of the current ($I_L$) that the second transconductance amplifier 284 can deliver to the load resistance 293 and therefore the voltage clipping level for the output 292 of the clipper 74.

The current source 297 is included as a part of the output control 90 shown in FIG. 1. With a substantially high loop gain, (ie., large amount of feedback) the overall voltage gain change of the clipper 74 will be substantially small as the current control is changed.

The preferred embodiment of the second amplifier 284 includes a bipolar transistor differential pair. The open loop gain of the circuit does tend to remain fairly constant as the controlled current supplied to the gain terminal of the second amplifier 284 is varied. This occurs because the input impedance of the second amplifier 284 varies substantially inversely with the control current.

Since this impedance is the most predominant load on the first amplifier 282, the voltage gain of the first amplifier will change approximately proportionally to this impedance, and approximately inversely to the voltage gain in the second amplifier 284. As a result, the circuit 74 gives a fairly constant open loop voltage gain. Thus, the present circuit provides a symmetrical, adjustable voltage limiting (clipping) while maintaining a substantially constant voltage gain (substantially independent of supply voltage).

The clipping level set by the device will not be substantially related to or substantially influenced by the saturation voltage drop of the transistors in the clipper 74 or the power supply voltage. Moreover, the clipper 74 operates at a low supply voltage level such as one volt.

The voltage across the input terminals 296, 302 of the second amplifier 284 is referred to hereafter in this section as $\Delta V_{be}$. A given $\Delta V_{be}$ will always produce a fixed ratio between the two collector currents in a bipolar transistor differential pair independent of the amplification factor ($g_{m2}$) selected for the second amplifier 284. Accordingly, the ratio of the current through the load resistor 293 to the peak available load current (or clipping level) is dependent substantially on $\Delta V_{be}$.

This voltage ($\Delta V_{be}$) may also be useful in other applications and is made available at an auxiliary output terminal 295. The equation expressing the ratio of current delivered to the load resistor 293 ($I_L$) to the peak available load current ($I_{PEAK}$) in terms of $V_{be}$ is as follows:

$$\frac{I_L}{I_{PEAK}} = \tanh\left(\frac{\Delta V_{be}}{2V_T}\right)$$

In the present invention, $V_{be}$ is used to drive the AGC detector 86 for the output compression system. The detector 86 is in the form of the threshold detector shown in FIG. 20 and has a voltage detection threshold of approximately 18 mV. Therefore, the output AGC system may be activated when $$\frac{I_L}{I_{PEAK}} \approx \tanh\left(\frac{18mV}{2(26mV)}\right) = .333$$

which (when expressed in decibels) is approximately −9.6dB. This means that a signal level which is about −9.6dB relative to the signal level at which clipping begins will begin to activate the output compression when the external AGC switch 88 is turned on. (See FIG. 2).

In such an application, the output compression level tracks below the voltage clipping level described above by a fixed ratio. In this manner, the "overshoot" during the automatic gain control attack is limited to a fixed ratio relative to the steady state output during compression and the output control 90 will also function when output AGC operation is selected.

Voltage Clamp (within, e.g., the Output Amplifier 76)

Dropping the voltage of a collector of a transistor on the integrated circuit even by an amount approaching one junction drop (0.6 Volts) below the lowest chip potential (that of the substrate) can have disasterous performance effects for the entire chip, because electrical isolation to surrounding chip components is lost, creating an undefined operating condition. A voltage clamp 314 prevents voltage swings at a node in an integrated circuit from going substantially negative with respect to the substrate and causing undesired operation. See FIG. 27.

Thus, for example, the receiver 40 of the present invention includes a center tapped inductor 316 which exerts a magnetic field to move the diaphram to create an acoustic output to the hearing aid user. The receiver 40 thus presents an inductive load, to the output amplifier 76 which drives it.

A mutual inductance between the two halves of the center tapped inductor 316 can result in a negative collector to emitter voltage spike alternately on one or the other of the output transistors 318, 320 which drive the receiver 40. In turn, this can forward bias the collector to substrate junction 322, causing parasitic lateral transistor action to surrounding devices.

In order to avoid such an occurance of unpredictable behavior in surrounding devices, the present hearing aid circuit 20 includes the clamp 314 in the output amplifier 36. The clamp 314 includes first and second voltage sensing transistors 324, 326, in the form of NPN transistors, a reference voltage source 328, including a biased diode connected NPN transistor 329, and an amplified current mirror 330.

In the preferred embodiment shown in FIG. 27, the receiver 40 is shown having the center tap inductor 316 interconnected to the first and second output transistors 318, 320, each of which has a collector 336, 338. The collectors 336, 338 are interconnected to the inductor 316 at respective nodes 340, 342. The clamp 314 prevents the voltage at the nodes 340, 342 from dropping substantially below zero.

The first and second output transistors 318, 320 have emitters directly connected to the substrate 322 of the chip. The reference voltage source 328 includes an NPN diode connected transistor 329 having a base 345 interconnected to a collector 344 and emitter 346. The emitter 346 is interconnected to the substrate 322. The collector 344 is interconnected to the bases of the first and second voltage sensing transistors 324, 326.

The collectors 336, 338 of the first and second output transistors 318, 320 are interconnected respectively to the emitters 325, 327 of transistors 324, 326. When both the collectors 336, 338 have voltages which are substantially above zero, the base-emitter junctions of transistors 324, 326 will be reverse biased or, at most, only slightly forward biased. Consequently, the reference voltage source 328 retains the first and second voltage sensing transistors 324, 326 in substantially a non-current drawing, nonconductive state As the voltage at one of the nodes 34 drops near zero, the base to emitter voltages ($V_{be1}$, $V_{be2}$), respectively, for the first or second transistors 324, 326 increases to about .6 volt, turning that first or second transistors 324, 326 on to a conductive state, thereby drawing a current ($I_{sense}$) through collector 331 or collector 333 (which are interconnected) of transistors 324 or 326. $I_{sense}$ is given by:

$$I_{sense} = I_o \exp(V_{be1}/V_T) + \exp(V_{be2}/V_T)$$

The amplified current mirror consists of transistors 348, 350, 352. The dual collector PNP transistor 348 is connected as a conventional current mirror to receive Isense and mirror this current to the interconnected bases of the first and second high current transistors 350, 352, which can amplify $I_{sense}$. Upon sensing that the collector to emitter voltages at the first or second voltage sensing transistors 324, 326 drops near zero, the dual collector PNP transistor 348 turns on supplying current to the bases of the two high current transistors 350, 352. The high current transistors 350, 352 then directly supply currents ($I_{clamp1}$ and $I_{clamp2}$) to the nodes 340, 342.

Two negative feedback loops are formed in the clamp 314. The first is formed by transistors 324, 348, 350, with the emitter 325 being the input and the emitter of high current transistor 350 being the output. The second loop is formed by transistors 326, 348 and 352 with the emitter 327 being the input and the emitter of high current transistor 352 being the output. Even though both loops could operate simultaneously if both nodes were forced near zero volts, and both loops share PNP transistor 348, the application of the preferred embodiment requires that only one node be clamped at a time, since the output transistors alternate conduction states. The bases of transistors 350, 352 are interconnected. Consequently, the ratio of currents delivered by the emitters of these transistors to nodes 340, 342 is dependent on the difference in voltage between these two nodes ($V_{diff}$) as follows:

$$I_{clamp1}/I_{clamp2} = \exp(V_{diff}/V_T).$$

Since $V_{diff}$ is typically greater than 2 volts when one node is being clamped, the high current transistor 350 or 352 connected to the other node is effectively turned off.

The node being clamped receives as much current (up to the limit $I_{max}$ described below) as is required to prevent the node from going substantially negative with respect to the substrate. As long as the current ratings of current source transistors 350, 352 are not exceeded, the maximum current ($I_{max}$) which can be supplied to the nodes 340, 342 is approximately equal to:

$$(\beta)^2 (I_{ref})$$

where $\beta$ (beta) is the current gain of the transistors 324, 326, 350, 352 and Iref is the current through the resistor 354 (which is also the standby current of the clamp 314).

Since a typical $\beta$ could be 100 or higher, the described clamp 314 uses a very low standby current drain relative to the maximum current sourcing ability of the clamp 314. Moreover, the clamping action occurs very close to the lowest potential supplied to the circuit. In addition, the clamp 314 may operate with a low supply voltage such as 1 volt.

The present clamp 314, with or without the amplified current mirror 330, may also be used simply to detect voltage levels close to the lowest (or highest if circuit polarities are inverted) supply potential, where $I_{sense}$ becomes a detection signal. In one such application, the amplified current mirror 330 is removed from the circuit, and the reference voltage source 328 is changed to a 0.9 volt source. Thus, the modified circuit may be used to detect output voltage and perform the function of the "$V_{out}$ detector" 80 shown in FIG. 2 for the output automatic gain control circuit contained within "output amplifier, clipper and output AGC" 36 of FIG. 2.

Base Bias Current Compensation Circuit (within, e.g., the Input Current Controlled Amplifier 46 and Main Current Controlled Amplifier 66)

It is often necessary to reduce the loading effect which the base bias current of a transistor has upon the circuit which drives the base of the transistor. As shown in FIG. 28, a base bias current compensator 358 supplies approximately the base bias current requirements of a reference transistor 362 which would otherwise have to be supplied by the other circuitry associated with the base of the reference transistor. The reference transistor is carrying an approximately known reference current ($I_c$) through its collector and has a beta (or current gain) which is known to track or match well with another transistor. This is usually the case in a given integrated circuit.

As shown in FIG. 28, the compensator 358 includes a current source 360 and a reference transistor 362, as well as a sampling transistor 364, first and second mirror transistors 368, 366 and feedback transistor 370. The most preferred embodiment also includes a diode connected transistor 372, an additional mirror transistor 374, and an additional reference transistor 376.

In the preferred embodiment, the transistors all are formed on the same integrated circuit chip. Thus, the emitter areas, current gain characteristics, and the transconductance characteristics of the NPN transistors may be fairly substantially controlled so that they bear a predetermined relation toward each other. The same holds true for PNP transistors, although the relationship between NPN and PNP characteristics is not well determined.

The reference transistor 362 handles a substantially known collector to emitter reference current, now designated $I_c$ in FIG. 28. A base current of $I_b$ which is equal to $I_c/B_{ref}$ (where $B_{ref}$ is the current gain of transistor 362), must be provided to the reference transistor 362 so as to substantially cancel the bias current that would be otherwise supplied by other circuitry associated with the base of transistor 362.

The current source 360 provides a current in a substantially known ratio to the reference current, now designated $(X)(I_c)$. The current source 360 supplies most of its current to the sampling transistor 364 (which has a beta approximately equal to $B_{ref}$. The current supplied to the base of the sampling transistor 364 is approximately equal to $(X)(I_B)$ (assuming that transistors 362 and 364 have approximately equal current gain). Current supplied to the base of the sampling transistor 364 is supplied by the collector of the first mirror transistor 368.

The feedback transistor 370 (interconnected as shown in FIG. 28) substantially forms a differential pair with the sampling transistor 364 and serves to adjust the collector current of the first mirror transistor 368 so as to regulate the collector current of the sampling transistor 364 to be approximately equal to XIc minus the collector current ($I_{FB}$) of feedback transistor 370. The base of transistor 370 is biased by a reference voltage Vref as shown in FIG. 28.

The diode connected transistor 372 which is in parallel with the base-emitter junction of first mirror transistor 368 is included in the preferred embodiment in order t reduce the effect of PNP beta (current gain) variation on $I_{FB}$. For the embodiment shown, $I_{FB}$ is approximately equal to $XI_B$. Therefore, since $XI_c/XI_B$ is approximately the current gain of the sampling transistor 364, the current source 360 will supply $XI_c - XI_c/B$ or $XI_c (1-1/B)$ to the sampling transistor 364. For typical betas, $(1-1/B)$ can be very close to unity.

The second mirror transistor 366 has its base and emitter interconnected respectively to the base and emitter of the first mirror transistor 368. By scaling the emitter areas of the first and second mirror transistors 368, 366 the current through the second mirror transistor 366 may be set to be in a predetermined ratio to the current through the collector of the first mirror transistor 368. This predetermined ratio may be set equal to 1/X. Since the current through the collector of the first mirror transistor 368 approximately equals $(X)(I_B)$, the current through the collector of the second mirror transistor 366 approximately equals $(X)(I_B)$ divided by X or $I_B$, which is approximately the desired base current for the reference transistor 362.

One or more additional mirror transistors (such as the transistor 374) may have its base-emitter junction placed in parallel with the base-emitter junction of the first and second mirror transistors 368, 366. Thus, additional reference transistors, such as the transistor 376, may have their base current requirements supplied as well.

By varying the ratio X and the ratios of the emitter areas of the mirror transistors, base compensation currents of arbitrary ratios are possible. The present application provides a very wide variety of applications where approximate cancellation of or compensation for base currents is required. Moreover, the compensator 358 operates at a very low supply voltage, such as one volt.

Input Automatic Gain Control System 600

A more detailed diagram of the input Automatic Gain Control ("AGC") system 600 is shown in FIG. 29. Certain circuit elements from FIG. 2 have been redrawn and renumbered in FIG. 29 as an aid for instruction.

The primary signal path is through the primary Current Controlled Amplifier ("CCA") 602. The primary CCA 602 is loaded by resistor $R_{LP}$ 630 and has full DC feedback taken from the junction of $R_{LP}$ 630 and capacitor 634. The capacitor 634 effectively bypasses AC feedback, providing substantially open loop AC operation.

Components 602, 630, 634 are contained in FIG. 2 as the main CCA 66. The balance of the circuit, shown in dotted lines 604, develops the primary control current $(I_{pc})$ for the primary CCA 602. The differential voltage controlled exponential current sources 612, 624, 626, designated Exp in FIG. 29, is shown in FIG. 23 and, as previously discussed, provides an output current $(I_{out})$ related to an input current $(I_{in})$ and control voltage $(V_c)$ according to the following equation:

$$I_{out} = I_{in} \left[ \exp\left(\frac{\Delta V_c}{V_T}\right) \right] x$$

where x is the emitter area ratio previously discussed, and $V_c = V_{be2} - V_{be1}$.

The current controlled amplifiers 602, 606 are operational transconductance amplifiers (OTAs), as previously discussed and shown in FIG. 22. The secondary CCA 606 is loaded by resistor $R_{LS}$ 632 and has full DC feedback taken from the junction of $R_{LS}$ 632 and capacitor 636. The capacitor 636 effectively bypasses AC feedback, providing substantially open loop AC operation. Components 606, 632, 636 are contained in FIG. 2 as the secondary CCA 700.

The input signal $(V_{in})$ (which in FIG. 2 comes from the variable slope control 64) is also amplified by the secondary CCA 606 whose output voltage developed across RLS 632 is applied to a threshold detector 702 consisting of the detector circuit shown in FIG. 20. The output of detector 702 is smoothed by the AGC filter capacitor 704 to develop a control signal $V_{c1}$.

The control signal, which is developed and measured with respect to a voltage reference $V_{ref}$, is fed back, via the exponential current source 612, as a secondary control current $(I_{sc})$ for the secondary CCA 606. If the input signal level is very low, then even when amplified by the secondary CCA 606, the signal level will be below the threshold of the threshold detector 608 and the control signal $\Delta V_{c1}$ will be zero.

Under this circumstance, the voltage across AGC filter capacitor 704 is kept at approximately $V_{ref}$ by the series resistor string made up of $R_{limit}$ 622 and the compression ratio control (CR) 620, interconnected between the output of the detector 702 and $V_{ref}$.

The gain $A_s$ of the secondary CCA 606 is determined by the current $(I_{sc})$ applied to its gain control input 642. The gain $A_s$ when $\Delta V_{c1} = 0$ is defined as $A_{so}$. The current out of Exp$_1$ 624 $(I_{th})$ (which is the input current to Exp$_2$) is:

$$I_{th} = [I_{sref} x_1] \left[ \exp\left(\frac{k_2 \Delta V_{c2}}{V_T}\right) \right]$$

where $k_2 V_{c2}$ is the voltage at the wiper arm 638 of potentiometer 616, having a total resistance $R_{thresh}$, whose end terminals are interconnected to $V_{ref}$ and fixed current source 618 having a value $I_{thresh}$. Therefore $K_2 \Delta V_{c2}$ may be varied by potentiometer 616 from zero volts to $V_{c2} = I_{thresh}$ times $R_{thresh}$ (as $K_2$ is varied from 0 to 1). $X_1$ is the emitter area ratio constant for current source Exp$_1$ 624, and $I_{sref}$ is supplied by fixed current source 628. The current out of Exp$_2$ 612 $(I_{sc})$ (which is the control current for the secondary CCA 606) is:

$$I_{sc} = [I_{th}][x_2] \exp\left(\frac{\Delta V_{c1}}{V_T}\right)$$

where $x_2$ is the emitter area ratio constant for current source Exp$_2$ 612. Thus $$I_{sc} = I_{sref}(x_1)(x_2) \left[ \exp\left(\frac{\Delta V_{c1} + k_2 \Delta V_{c2}}{V_T}\right) \right]$$

Thus, when $\Delta V_{c1}$ is zero (signal level below the AGC threshold), $$I_{sc} = [I_{sref}(x_1)(x_2)] \left[ \exp\left(\frac{\Delta V_{c2}}{V_T}\right) \right]$$

and varying the setting of the threshold control 616 varies the gain $A_{so}$ of the secondary CCA and thus the amplitude of $V_{in}$ required to trigger the threshold detector. The threshold $V_{th}$ of the threshold detector 702 is reached when $A_{so} V_{in} = V_{th}$. This occurs when $$V_{in} = \left[\frac{V_{th}}{A_{so}}\right]\left[\frac{1}{\exp\left(\frac{K_2 \Delta V_{c2}}{V_T}\right)}\right]$$

Accordingly, the threshold is adjusted in an exponential manner by $K_2$, the setting of the threshold control 616. When the threshold is exceeded the threshold detector 702 discharges filter capacitor 704 and $V_{c1}$ decreases from zero, decreasing the gain ($A_s$) of the secondary CCA 606. This forms a feedback system, and with high loop gain, the system will keep the output of the secondary CCA 606 very close the detector threshold $V_{th}$. Then, for input levels above the threshold point, $$A_s(V_{in}) = [A_{so}(V_{in})]\left[\exp\left(\frac{\Delta V_{c1}}{V_T}\right)\right] \approx V_{th}.$$

An adjustable portion ($K_1 \Delta V_{c1}$) of the control signal $\Delta V_{c1}$ taken from the wiper arm 640 of the compression ratio control (potentiometer) 620 is used as a feedforward signal to control the gain of the primary CCA 602. $K_1$ varies from 0 to 1 (or to some other preselected limit less than 1 determined by $R_{limit}$ 622) by adjustment of the control 620. $K_1 \Delta V_{c1}$ is applied to the voltage inputs of current source $Exp_3$ 626 and $I_{pref}$ from fixed current source 614 is the current input to $Exp_3$. The output current from $Exp_3$, designated $I_{pc}$ (which is applied to the gain control terminal 644 of the primary CCA 602) is given by:

$$I_{pc} = [I_{pref}(X_3)]\left[\exp\left(\frac{K_1 \Delta V_{c1}}{V_T}\right)\right]$$

where $x_3$ is the emitter area ratio constant for current source $Exp_3$ 626.

The gain $A_p$ of the primary CCA 602 is given by $$A_p = [(A_{po})][\exp(K_1 \Delta V_{c1}/V_T)]$$

Below the threshhold, $V_{c1} = 0$ and the CCA 602 has a fixed gain $A_{po}$. Above the threshhold, the gain is given by:

$$A_p = A_{po}\left[\exp\left(\frac{\Delta V_{c1}}{V_T}\right)\right]^{K_1} = (A_{po})[V_{th}/(V_{in}A_{so})]^{K_1}$$

The output signal is $V_{out} = (A_{po})(V_{in})$. Expressed in decibels, where L is the amplitude in (dB) and G is the gain in (dB), $L_{in} = 20 \log (V_{in})$; $L_{out} = 20 \log (V_{out})$, and $G_{po} = 20 \log (A_{po})$. Below threshold, $L_{out} = L_{in} + G_{po}$. Above threshold, $L_{out} = G_{po} + L_{inth} + (1-K_1)(L_{in} - L_{inth})$ where $L_{inth}$ is the input level corresponding to threshold and is given by $$L_{inth} = 20 \log (V_{th}/A_{so}) = 20 \log \left\{V_{in}\left[\exp\left(\frac{K_2 \Delta V_{c2}}{V_T}\right)\right]\right\}$$

These characteristics are illustrated in the output versus input curve shown in FIG. 30.

Also, in the preferred embodiment, the base bias compensation circuits, as shown in FIG. 28 and previously discussed, are interconnected to the positive and negative inputs of the primary and secondary CCA's 602, 606 and substantially supply their input base current requirements. This reduces feedthru of the gain control currents $I_{pc}$, $I_{sc}$ into the signal paths of the CCAs. Such feedthru may cause undesirable clicks and thumps in the signal as well as cause transient signal amplitude aberrations during the attack and decay periods of AGC operation.

In addition, in the preferred embodiment, the compand control voltage ($V_c$ in FIG. 21) is applied to the negative input of $Exp_2$(612) in place of $V_{ref}$ to complete the compansion system and provide a linear input/output relationship between microphone output 22 and detector 702 input.

A variety of preferred embodiments of the present invention have been described herein. It is to be understood, of course, that changes and modifications may be made in embodiments without departing from the true scope and spirit of the present invention, as defined by the appended claims.

What is claimed is:

1. A variable slope filter, for receiving an input signal at an input terminal and providing an output signal related to said input signal, comprising, in combination:
   transconductance means, having an input interconnected to said terminal, for receiving said input signal and responsively providing a transconductance signal at a first output line Ⓡ, and having feedback input interconnected to said first output line;
   a ground line;
   a capacitor interconnected between said first output line and ground line;
   amplifier means, interconneted to said input terminal and said line, for receiving said input signal and said transconductance signal and responsively providing an amplifier signal at a second output line; and
   a potentiometer, interconnected between said first and second output lines, said potentiometer including a wiper for adjusting said potentiometer, said wiper providing said out signal.

2. A variable slope filter, for receiving an input signal at an input terminal and providing an output signal related to said input signal, comprising, in combination:
   first transconductance means, interconnected to said input terminal, for receiving said input signal and responsively providing a first amplifier signal at a first output line, and having a feedback input interconnected to said first output line;
   a ground line;
   a capacitor interconnected between said first output line and said ground line;
   second transconductance means, in a differential mode, with inputs interconnected between said input terminal and said first output line, for receiving said input signal and said first amplifier signal and responsively providing a second amplifier signal at a second output line;

a reference voltage supply;

third transconductance means, in a differential mode, with an output interconnected both to said second output line and one input, and having the other input interconnected to said reference voltage supply, for providing aload impedance for said second differ(R)ential transconductance means; and a potentiometer, interconnected between said first and second output lines said potentiometer including a wiper for adjusting said potentiometer, said wiper providing said input signal.

3. An electronic frequency filter for receiving an input signal and providing filtered output signals comprising, in combination:

a sum-difference amplifier for receiving and combining said input signal and two feedback signals to provide an output signal;

a first integrator for receiving said output signal from said sum-difference amplifier and providing a first integrated signal;

a second integrator for receiving said first integrated signal and providing a second integrated signal, each of said integrators comprising a transconductance amplifier which defines a transconductance;

at least one control line for supplying a control current to at least one of said transconductance amplifiers, whereby said transconductance may be varied by said control current;

first and second feedback lines for providing said first and the second integrated signals, as said two feedback signals, to said sum-difference amplifier; and a control circuit with a control signal input for receiving a control input signal and current means for providing two control currents related to said control input signal, said current means providing control signals to said transconductance amplifiers and maintaining a substantially constant ratio between said two control currents as said control input signal is varied, each of said control currents being fixed by an integer number of substantially identical transductance devices connected in parallel said integer number for at least one of said output control currents being greater than one, whereby said output of said sum-difference amplifier provides highpass filtered output signal, said first integrated signal providing a bandpass filtered output signal and said second integrated signal providing a lowpass filtered signal.

4. A filter as claimed in claim 3 wherein each transconductance amplifier of each integrator having an output loaded by a grounded capacitor.

5. A filter as claimed in claim 4 wherein said control circuit comprises a dual output current mirror fed by a single input control current.

6. A filter as claimed in claim 5 wherein circuit includes transconductance devices each of said transconductance devices includes input terminals interconnected to said control signal input.

* * * * *